(12) United States Patent
Kikuchi

(10) Patent No.: US 12,436,182 B2
(45) Date of Patent: Oct. 7, 2025

(54) MEASUREMENT PATTERN, MEASUREMENT PATTERN SET, CALCULATION METHOD, NON-TRANSITORY COMPUTER-READABLE RECORDING MEDIUM AND CALCULATION DEVICE

(71) Applicant: Sumitomo Electric Industries, Ltd., Osaka (JP)

(72) Inventor: Ken Kikuchi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 168 days.

(21) Appl. No.: 18/499,531

(22) Filed: Nov. 1, 2023

(65) Prior Publication Data

US 2024/0159817 A1    May 16, 2024

(30) Foreign Application Priority Data

Nov. 11, 2022    (JP) ................. 2022-180761

(51) Int. Cl.

| | | |
|---|---|---|
| *G01R 31/26* | (2020.01) | |
| *G01R 1/02* | (2006.01) | |
| *G01R 1/04* | (2006.01) | |
| *G01R 1/067* | (2006.01) | |
| *G01R 1/073* | (2006.01) | |
| *H01L 27/02* | (2006.01) | |
| *H01L 27/06* | (2006.01) | |
| *H01L 27/088* | (2006.01) | |

(52) U.S. Cl.
CPC ..... *G01R 31/2621* (2013.01); *G01R 1/06772* (2013.01)

(58) Field of Classification Search
CPC . G01R 1/02; G01R 1/04; G01R 1/067; G01R 1/073; H01L 27/02; H01L 27/06; H01L 27/088

See application file for complete search history.

(56) References Cited

U.S. PATENT DOCUMENTS

2016/0254190 A1* 9/2016 Hsieh ................. H10D 84/0193
438/283

FOREIGN PATENT DOCUMENTS

JP    11-287839 A    10/1999

* cited by examiner

*Primary Examiner* — Neel D Shah
(74) *Attorney, Agent, or Firm* — Volpe Koenig

(57) ABSTRACT

The present disclosure relates to a measurement pattern for measuring a high frequency characteristic of a first element including a first input electrode, a first output electrode, and a first reference electrode. The measurement pattern includes a second element including a second input electrode having a planar shape corresponding to a planar shape of the first input electrode, a second output electrode having a planar shape corresponding to a planar shape of the first output electrode, and a second reference electrode overlapping the second input electrode and the second output electrode, an input pad connected to the second input electrode, an output pad connected to the second output electrode, and a reference pad connected to the second reference electrode, provided from the input pad to the output pad when viewed from a first direction, and having a planar shape linearly symmetric with respect to a virtual straight line.

15 Claims, 21 Drawing Sheets

US 12,436,182 B2

MEASUREMENT PATTERN, MEASUREMENT PATTERN SET, CALCULATION METHOD, NON-TRANSITORY COMPUTER-READABLE RECORDING MEDIUM AND CALCULATION DEVICE

CROSS REFERENCE TO RELATED APPLICATIONS

This application claims priority based on Japanese Patent Application No. 2022-180761 filed on Nov. 11, 2022, and the entire contents of the Japanese patent applications are incorporated herein by reference.

FIELD

The present disclosure relates to a measurement pattern, a measurement pattern set, a calculation method, a non-transitory computer-readable recording medium, and a calculation device.

BACKGROUND

In designing a high frequency circuit using a high frequency element such as a transistor, a model expressing high frequency characteristics of the high frequency element is used. The measurement of the high frequency characteristics of the high frequency element is performed by bringing a high frequency probe into contact with an input pad to which a high frequency signal is input and a reference pad to which a reference potential is supplied, and bringing a high frequency probe into contact with an output pad to which a high frequency signal is output and a reference pad (for example, Patent Document 1: Japanese Patent Application Laid-Open No. 11-287839).

SUMMARY

A measurement pattern according to the present disclosure is a measurement pattern for measuring a high frequency characteristic of a first element. The first element includes a first input electrode to which a high frequency signal is input, a first output electrode from which the high frequency signal is output, and a first reference electrode to which a reference potential is supplied, which overlaps with the first input electrode and the first output electrode when viewed from a first direction, and which has a planar shape that is non-linearly symmetric with respect to any virtual straight lines extending in the first direction. The measurement pattern according to the present disclosure includes a second element including: a second input electrode having a planar shape corresponding to a planar shape of the first input electrode in at least a partial region of the first element in a second direction orthogonal to the first direction; a second output electrode having a planar shape corresponding to a planar shape of the first output electrode in the at least partial region; and a second reference electrode overlapping the second input electrode and the second output electrode when viewed from the first direction and having a planar shape that is linearly symmetric with respect to a virtual straight line extending in the first direction; an input pad connected to the second input electrode; an output pad connected to the second output electrode so as to dispose the second input electrode and the second output electrode between the input pad and the output pad in the second direction; and a reference pad connected to the second reference electrode, provided from the input pad to the output pad when viewed from the first direction, and having a planar shape that is linearly symmetric with respect to the virtual straight line.

DETAILED DESCRIPTION OF EMBODIMENTS

Figure 1:
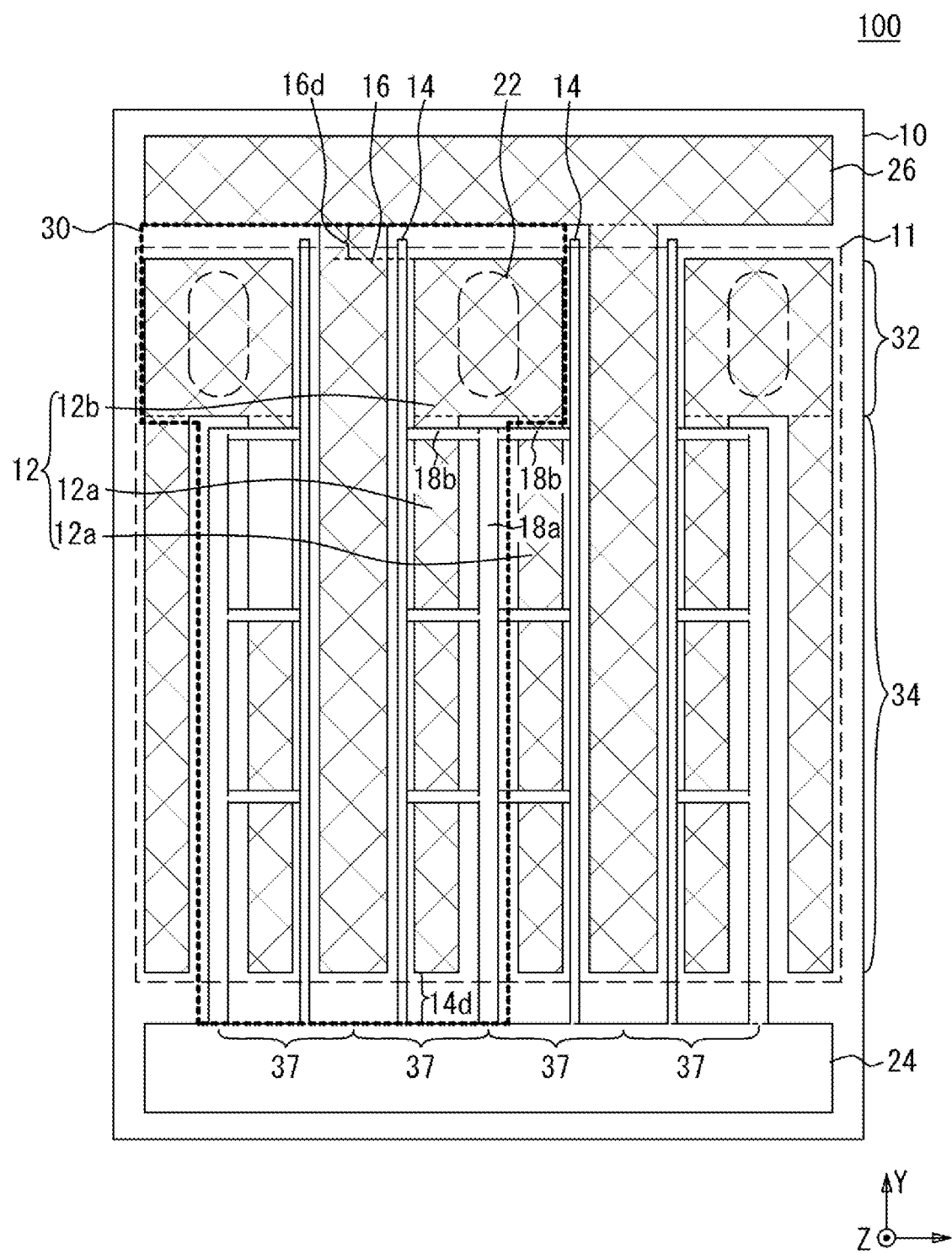
FIG. 1 is a plan view of a field effect transistor (FET) according to a first embodiment.

When the high frequency element is asymmetric, the reference pads are asymmetric. Therefore, it becomes difficult to remove the influence of the reference pads used when measuring the high frequency characteristics of the high frequency element. As a result, the accuracy of a high frequency characteristic model used for designing a high frequency circuit using a high frequency element is reduced.

The present disclosure has been made in view of the above problems, and an object of the present disclosure is to improve the accuracy of the high frequency characteristics.

Details of Embodiments of the Present Disclosure

First, the contents of the embodiments of this disclosure are listed and explained.

(1) A measurement pattern according to the present disclosure is a measurement pattern for measuring a high frequency characteristic of a first element. The first element includes a first input electrode to which a high frequency signal is input, a first output electrode from which the high frequency signal is output, and a first reference electrode to which a reference potential is supplied, which overlaps with the first input electrode and the first output electrode when viewed from a first direction, and which has a planar shape that is non-linearly symmetric with respect to any virtual straight lines extending in the first direction. The measurement pattern according to the present disclosure includes a second element including: a second input electrode having a planar shape corresponding to a planar shape of the first input electrode in at least a partial region of the first element in a second direction orthogonal to the first direction; a second output electrode having a planar shape corresponding to a planar shape of the first output electrode in the at least partial region; and a second reference electrode overlapping the second input electrode and the second output electrode when viewed from the first direction and having a planar shape that is linearly symmetric with respect to a virtual straight line extending in the first direction; an input pad connected to the second input electrode; an output pad connected to the second output electrode so as to dispose the second input electrode and the second output electrode between the input pad and the output pad in the second direction; and a reference pad connected to the second reference electrode, provided from the input pad to the output pad when viewed from the first direction, and having a planar shape that is linearly symmetric with respect to the virtual straight line. Thus, the accuracy of the high frequency characteristics can be improved.

(2) In the above (1), the first input electrode, the first output electrode, and the first reference electrode may extend in the second direction, the first element may have a first region and a second region arranged in the second direction, and a width in the first direction of the first reference electrode in the second region may be narrower than a width in the first direction of the first reference electrode in the first region.

(3) In the above (2), the first element may be provided on a substrate, the first reference electrode in the first region may be electrically connected to a metal layer provided on a lower surface of the substrate via a via hole penetrating through the substrate, the first reference electrode in the second region may be electrically connected to the metal layer via the first reference electrode and the via hole in the first region, and the second region may not be provided with a via hole.

(4) In the above (2), the first element may include a wiring extending in the second direction in the second region and overlapping with the first reference electrode and the first input electrode when viewed from the first direction, the first reference electrode may be disposed between the first output electrode and the wiring in the first direction, the wiring and the first input electrode may be electrically connected at one or more locations in the second direction, and the wiring may not be provided in the first region.

(5) In any one of the above (2) to (4), the first element may be a transistor, and the first input electrode, the first output electrode, and the first reference electrode may be a gate electrode, a drain electrode, and a source electrode, respectively.

(6) In any one of the above (1) to (5), a pair of first reference electrodes may be provided so as to dispose the first input electrode and the first output electrode between the pair of first reference electrodes, and a pair of second reference electrodes may be provided so as to dispose the second input electrode and the second output electrode between the pair of second reference electrodes.

(7) In any one of the above (1) to (6), a first high frequency probe may be contactable with the reference pad and the input pad and a second high frequency probe may be contactable with the reference pad and the output pad.

(8) A measurement pattern set may include a first measurement pattern that is the measurement pattern according to claim 2, wherein planar shapes of the second input electrode and the second output electrode correspond to planar shapes of the first input electrode and the first output electrode in the first region, respectively; and a second measurement pattern that is the measurement pattern according to claim 2, wherein planar shapes of the second input electrode and the second output electrode correspond to planar shapes of the first input electrode and the first output electrode in at least a partial region of the second region in the second direction, respectively.

(9) A calculation method according to the present disclosure is a calculation method executed by a processor to execute a process. The process may include acquiring a first high frequency characteristic of the second element measured using the measurement pattern according to any one of the above (1) to (7); acquiring a second high frequency characteristic in at least a part of a difference portion in shape between the first element and the second element, the second high frequency characteristic being calculated by simulation; and calculating a high frequency characteristic of the first element based on the first high frequency characteristic and the second high frequency characteristic.

(10) A calculation method according to the present disclosure is a calculation method executed by a processor to execute a process. The process may include acquiring a first high frequency characteristic of the second element measured using the measurement pattern according to any one of the above (2) to (5); acquiring a second high frequency characteristic of a transmission line corresponding to the first reference electrode in the second region, the second high frequency characteristic being calculated by simulation; and calculating a high frequency characteristic of the first element based on the first high frequency characteristic and the second high frequency characteristic.

(11) A calculation method according to the present disclosure is a calculation method executed by a processor to execute a process. The process may include acquiring a first high frequency characteristic of the second element measured using the measurement pattern according to the above (3); acquiring a second high frequency characteristic of the via hole in the first region, the second high frequency characteristic being calculated by simulation; and calculating a high frequency characteristic of the first element based on the first high frequency characteristic and the second high frequency characteristic.

(12) A calculation method according to the present disclosure is a calculation method executed by a processor to execute a process. The process may include acquiring a first high frequency characteristic of the second element measured using the measurement pattern according to the above (4); acquiring a second high frequency characteristic of a transmission line corresponding to the wiring, the second high frequency characteristic being calculated by simulation; and calculating a high frequency characteristic of the first element based on the first high frequency characteristic and the second high frequency characteristic.

(13) A calculation method according to the present disclosure is a calculation method executed by a processor to execute a process. The process may include acquiring a first high frequency characteristic of the second element measured using the first measurement pattern of the measurement pattern set according to the above (8); acquiring a second high frequency characteristic of the second element measured using the second measurement pattern of the measurement pattern set; acquiring a third high frequency characteristic of the transmission line corresponding to the first reference electrode in the second region, the third high frequency characteristic being calculated by simulation; and calculating a high frequency characteristic of the first element based on the first high frequency characteristic, the second high frequency characteristic, and the third high frequency characteristic.

(14) A non-transitory computer-readable recording medium according to the present disclosure is a non-transitory computer-readable recording medium storing a program that causes a processor to execute a process. The process may include acquiring a first high frequency characteristic of the second element measured using the measurement pattern according to any one of the above (1) to (7); acquiring a second high frequency characteristic in at least a part of a difference portion in shape between the first element and the second element, the second high frequency characteristic being calculated by simulation; and calculating a high frequency characteristic of the first element based on the first high frequency characteristic and the second high frequency characteristic.

(15) A calculation device according to the present disclosure may include a memory; and a processor coupled to the memory and the processor configured to: acquire a first high frequency characteristic of the second element measured using the measurement pattern according to any one of the above (1) to (7); acquire a second high frequency characteristic in at least a part of a difference portion in shape between the first element and the second element, the second high frequency characteristic being calculated by simulation; and calculate a high frequency characteristic of the first element based on the first high frequency characteristic and the second high frequency characteristic.

Specific examples of the measurement pattern, the measurement pattern set, the calculation method, the non-transitory computer-readable recording medium, and the calculation device in accordance with embodiments of the present disclosure are described below with reference to the drawings. The present disclosure is not limited to these examples, but is indicated by the claims, which are intended to include all variations within the meaning and scope of the claims.

At least some of the embodiments described below may be randomly combined. The calculation device includes a computer, and each function of the calculation device is exhibited when a computer program stored in a storage device of the computer is executed by a CPU (Central Processing Unit) of the computer. The computer program can be stored in a storage medium such as a CD-ROM (Compact Disc Read Only Memory) or a DVD (Digital Versatile Disc).

First Embodiment

In the first embodiment, a measurement pattern and a calculation program for constructing a model (for example, a large signal model) of high frequency characteristics of a field effect transistor (FET) as a high frequency element will be described.

[Structure of FET to be Modeled]

First, the structure of the FET to be modeled will be described. FIG. 1 is a plan view of the FET according to the first embodiment. A normal direction of an upper surface of a substrate 10 is defined as a Z direction, an extending direction of finger-shaped source electrodes 12, gate electrodes 14 and drain electrodes 16 is defined as a Y direction (i.e., a second direction orthogonal to a first direction), and an arrangement direction is defined as an X direction (i.e., the first direction).

As illustrated in FIG. 1, in an FET 100, an active region 11 is provided on the upper surface of the substrate 10. A region other than the active region 11 is an inactive region. The plurality of source electrodes 12, the plurality of gate electrodes 14 and the plurality of drain electrodes 16 are provided on the active region 11 of the substrate 10. The plurality of source electrodes 12 and the plurality of drain electrodes 16 are alternately provided one by one in the X direction. The single gate electrode 14 is provided between the single source electrode 12 and the single drain electrode 16. The single source electrode 12, the single drain electrode 16, and the single gate electrode 14 form a unit FET 37. The plurality of unit FETs 37 are arranged in the X direction. The unit FET 37 has regions 34 and 32 arranged in the Y direction.

The widths of the gate electrode 14 in the regions 34 and 32 in the X direction are equal to each other, and the widths of the drain electrode 16 in the regions 34 and 32 in the X direction are equal to each other. The width of the source electrode 12 in a region 34 is smaller than the width of the source electrode 12 in the region 32. A via hole 22 is provided in the source electrode 12b in the region 32. Two source electrodes 12a in the region 34 are connected to the single source electrode 12b in the region 32. A wiring 18a extending in the Y direction is provided between the two source electrodes 12a in the region 34. The wiring 18a is connected to the gate electrode 14 by a wiring 18b extending in the X direction.

Positive ends (+ ends) in the Y direction of the plurality of drain electrodes 16 are electrically connected to a drain bus bar 26. Negative ends (− ends) in the Y direction of the plurality of gate electrodes 14 and the plurality of wirings 18a are electrically connected to a gate bus bar 24. A portion of the drain electrode 16 which protrudes from the source electrode 12 in the Y direction and is connected to the drain bus bar 26 is a connecting portion 16d. A portion of the gate electrode 14 which protrudes from the source electrode 12 in the Y-direction and is connected to the gate bus bar 24 is a connecting portion 14d.

The single drain electrode 16, a pair of gate electrodes 14 disposing the drain electrode 16 therebetween, a pair of source electrodes 12a and 12b disposing the pair of gate electrodes 14 therebetween, and a pair of wirings 18a disposing the pair of source electrodes 12a therebetween in the region 34 form a unit cell 30. By arranging a desired number of unit cells 30 in the X direction, an FET having a plurality of unit FETs 37 is formed.

[Structure of Unit Cell]

Figure 2:
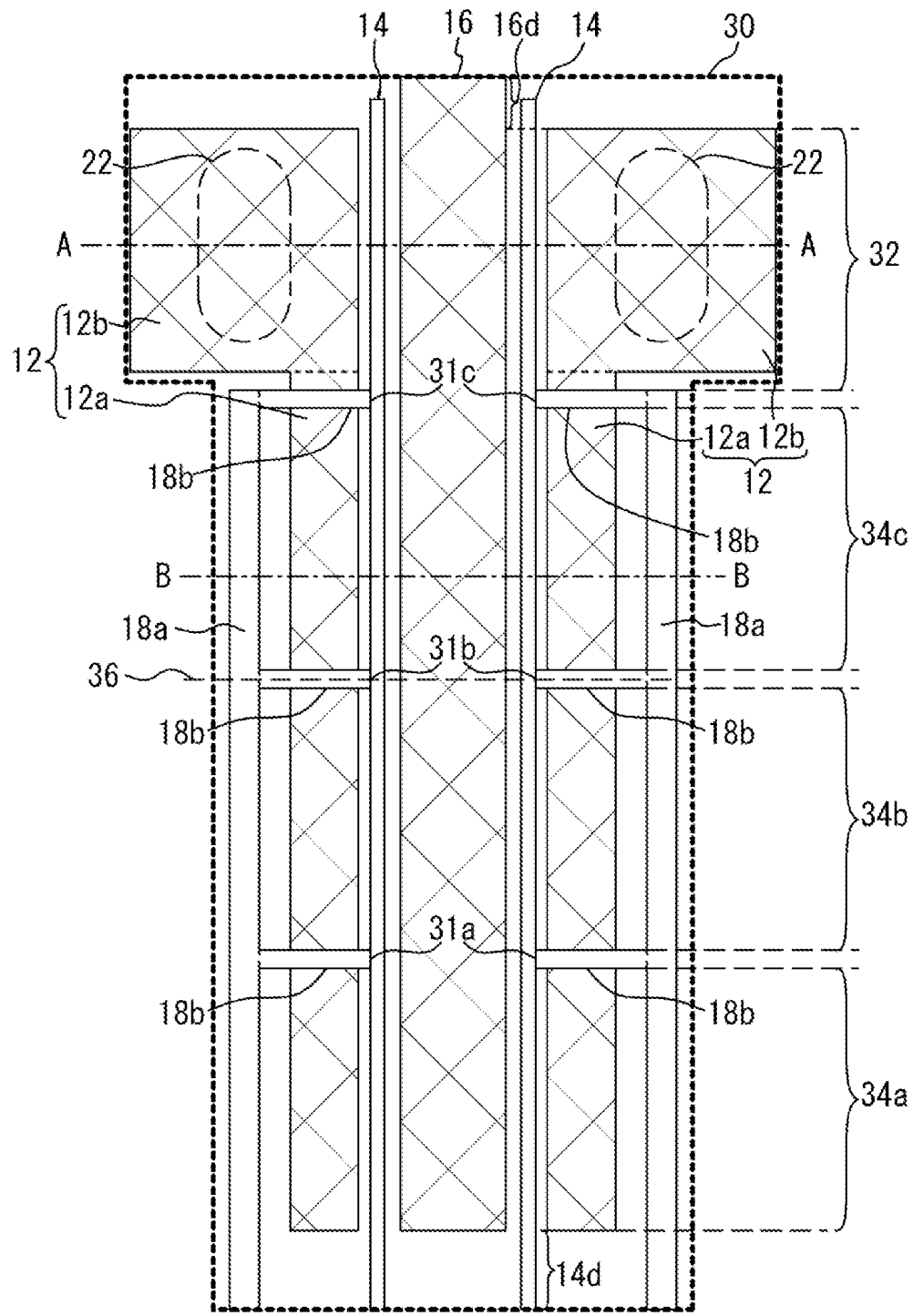
FIG. 2 is a plan view of a unit cell according to the first embodiment.
Figure 3:
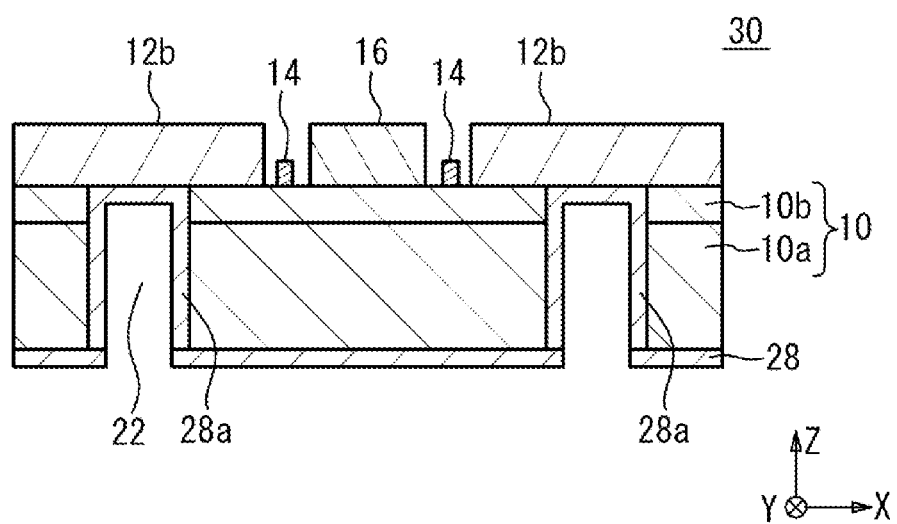
FIG. 3 is a cross-sectional view taken along line A-A of FIG. 2.
Figure 4:
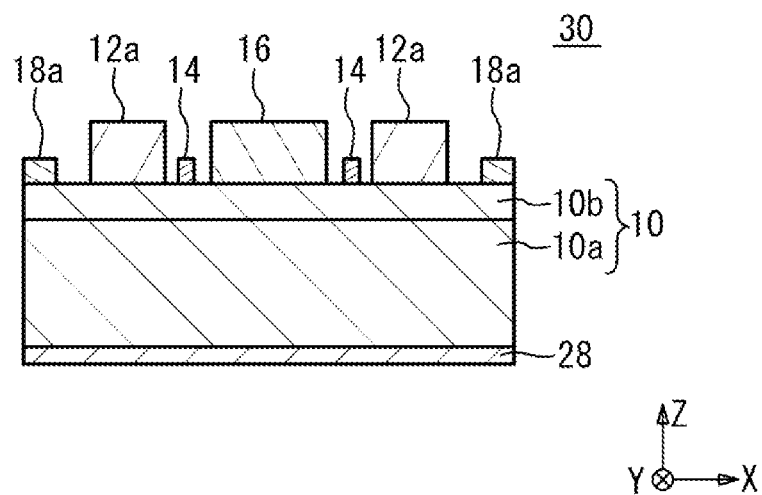
FIG. 4 is a cross-sectional view taken along line B-B of FIG. 2.

FIG. 2 is a plan view of the unit cell according to the first embodiment. FIGS. 3 and 4 are cross-sectional views taken along line A-A and B-B in FIG. 2, respectively. As illustrated in FIGS. 2 to 4, the substrate 10 includes a substrate 10a and a semiconductor layer 10b provided on the substrate 10a. A metal layer 28 is provided on the lower surface of the substrate 10. A reference potential such as a ground potential is supplied to the metal layer 28.

In the region 32 on the substrate 10, the source electrodes 12b, the gate electrodes 14 and the drain electrode 16 are provided. The substrate 10 under the source electrodes 12b is provided with via holes 22 penetrating through the substrate 10. The source electrodes 12b are electrically connected to the metal layer 28 via a metal layer 28a formed on inner surfaces of the via holes 22. Thus, the source electrodes 12b are electrically connected to and short-circuited with the metal layer 28. The source electrodes 12b and the metal layer 28 have substantially the same potential, and the reference potential supplied to the metal layer 28 is supplied to the source electrodes 12b. A portion of the drain electrode 16 projecting from the source electrode 12 in the + direction of the Y direction is the connecting portion 16d, and the length of the connecting portion 16d in the Y direction is the same as the length of the connecting portion 16d in the Y direction of FIG. 1.

In the region 34 on the substrate 10, the wirings 18a, the source electrodes 12a, the gate electrodes 14 and the drain electrode 16 are provided. No via hole is provided in the source electrodes 12a, and the reference potential is supplied to the source electrodes 12b via the source electrodes 12a and the via holes 22. In three positions 31a to 31c of the gate electrodes 14 in the Y direction, the wirings 18a are electrically connected to the gate electrodes 14 via the wirings 18b. The wirings 18b and the source electrodes 12a cross each other through an insulating layer and are not electrically connected to each other. The number of the positions 31a to 31c in the Y direction may be one or plural. The region 34 is divided into a plurality of regions 34a to 34c bounded by the positions 31a to 31c in the Y direction. Portions of the gate electrodes 14 projecting from the source electrode 12 in the − direction of the Y direction are connecting portions 14d, and the lengths of the connecting portions 14d in the Y direction are the same as the lengths of the connecting portions 14d in FIG. 1 in the Y direction.

When the FET 100 is a nitride-semiconductor device such as a GaN HEMT (Gallium Nitride High Electron Mobility Transistor), the substrate 10a is, for example, a SiC substrate, a diamond substrate, a silicon substrate, a GaN substrate, or a sapphire substrate. The semiconductor layer 10b includes, for example, a nitride semiconductor layer such as a GaN layer, an AlGaN layer and/or an InGaN layer. In the case of the GaN HEMT, the semiconductor layer 10b includes a GaN electron transport layer and an AlGaN barrier layer disposed on the GaN electron transport layer. When the semiconductor device is, for example, a GaAs-based semiconductor device, the substrate 10a is, for example, a GaAs substrate. The semiconductor layer 10b includes, for example, an arsenide semiconductor layer such as a GaAs layer, an AlGaAs layer and/or an InGaAs layer.

Each of the source electrodes 12 and the drain electrode 16 includes, for example, an adhesion film (for example, a titanium film) provided on the substrate 10 and a metal film such as an aluminum film provided on the adhesion film. Each of the gate electrodes 14 and the wirings 18a includes, for example, an adhesion film (for example, a nickel film) provided on the substrate 10 and a metal film such as a gold film provided on the adhesion film.

When the lengths of the gate electrodes 14 are increased in the Y direction, a gate resistance increases. In the unit cell 30, by providing the wirings 18a and 18b, one or a plurality of positions 31a to 31c at which a high frequency signal is supplied to the gate electrodes 14 in the Y direction can be provided. Thus, the substantial gate resistance can be reduced. In order to provide the wiring 18a, in the region 34, the width of the source electrode 12a in the X direction is made smaller than the width of the source electrode 12b in the X direction. A virtual straight line 36 (virtual straight line) extending in the X direction is assumed. The unit cell 30 (in particular, the source electrodes 12) is non-linearly symmetric not only with respect to the virtual straight line 36 but also with respect to any virtual straight line 36 extending in the X direction.

[Example of Measurement Pattern of Unit Cell]

Figure 5:
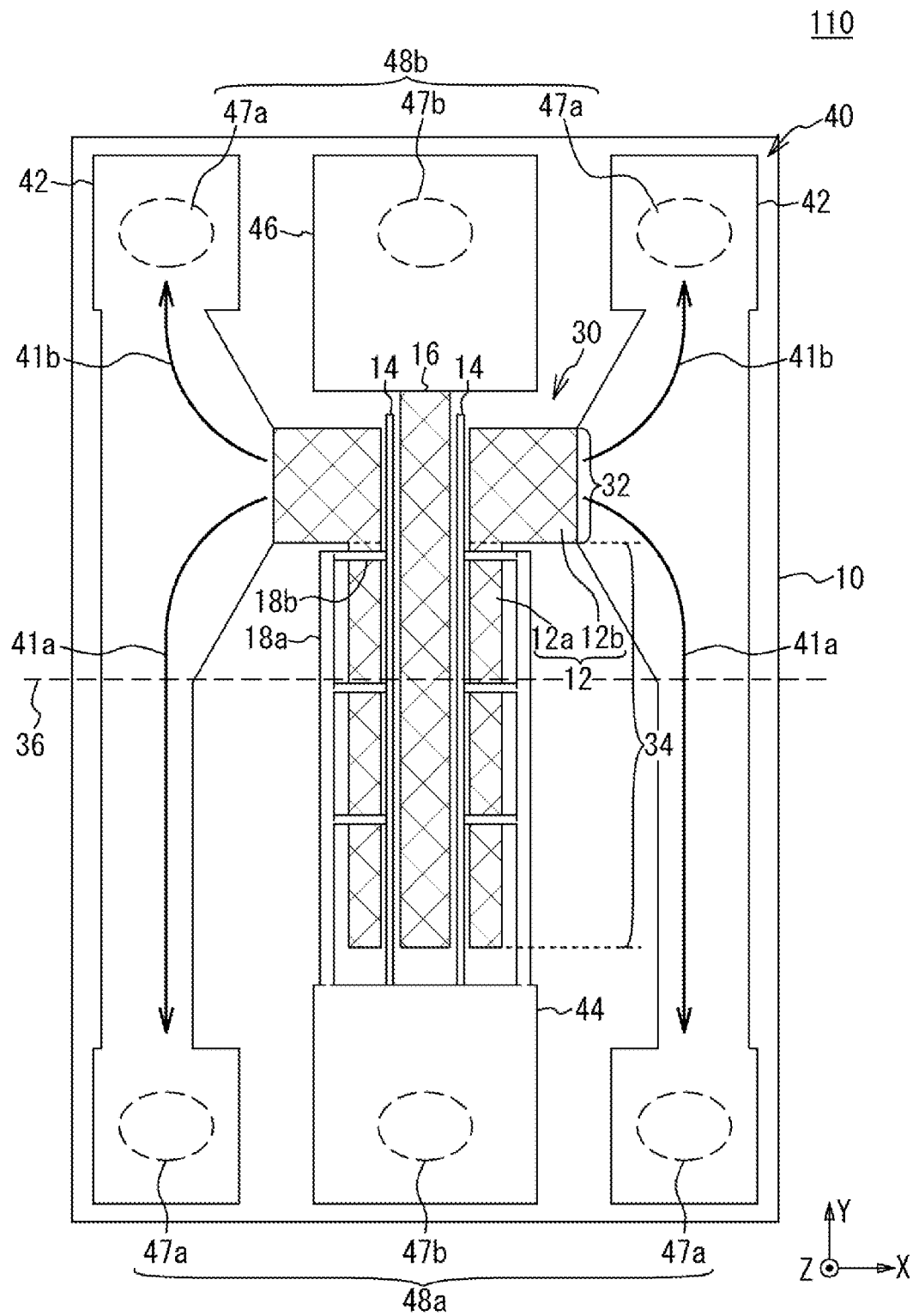
FIG. 5 is a plan view illustrating a measurement pattern according to the first embodiment.

A measurement pattern for measuring the high frequency characteristics of the unit cell 30 will be described. FIG. 5 is a plan view illustrating the measurement pattern according to the first embodiment. As illustrated in FIG. 5, in a measurement pattern 110, the unit cell 30 and a launcher 40 are provided on the substrate 10. No via hole is provided in the unit cell 30. The launcher 40 includes reference pads 42, an input pad 44, and an output pad 46. A pair of reference pads 42 are provided so as to dispose the unit cell 30, the input pad 44 and the output pad 46 between the pair of reference pads 42 in the X direction. The pair of reference pads 42 are connected to the source electrodes 12b. The source electrodes 12a are electrically connected to the reference pads 42 via the source electrodes 12b. This corresponds to the fact that in the actual unit cell 30 illustrated in FIG. 2, the source electrodes 12a are supplied with the reference potential through the source electrodes 12b and the via holes 22. In order to accurately measure the high frequency characteristics of the unit cell 30, the reference pads 42 are connected to the source electrodes 12b. The launcher 40 is, for example, a metal film such as a gold film.

A high frequency probe 48a having ground probes 47a and a signal probe 47b is in contact with the vicinity of the negative ends (− ends) in the Y direction of the pair of reference pads 42 and the input pads 44. A high frequency probe 48b having ground probes 47a and the signal probe 47b is in contact with the vicinity of the positive ends (+ ends) in the Y direction of the pair of reference pads 42 and the output pads 46.

In the measurement pattern 110, since the unit cell 30 is asymmetric with respect to any virtual straight line 36, the reference pad 42 is asymmetric with respect to any virtual straight line 36. In this case, current return paths 41a from the unit cell 30 toward the input pad 44 and current return paths 41b from the unit cell 30 toward the output pad 46 are asymmetric with each other. When the high frequency characteristics of the unit cell 30 are measured by using the measurement pattern 110, so-called de-embedding is performed to remove the high frequency characteristics of the launcher 40 from the measured high frequency characteristics (for example, the S parameters). There is an open-short method as a de-embedding method. However, the open-short method is based on the premise that the launcher 40 is linearly symmetric with respect to the virtual straight line 36 when the virtual straight line 36 is defined as the center line in the Y direction of the launcher 40, and if the launcher 40 is asymmetric with respect to the virtual straight line 36, the accuracy of the high frequency characteristics is reduced.

The first embodiment provides a program and a calculation method for accurately calculating the high frequency characteristics of the unit cell 30 when the unit cell 30 is asymmetric. Hereinafter, the calculation method and the measurement pattern for calculating the high frequency characteristics of the unit cell 30 according to the first embodiment will be described.

[Block Diagram of Computer]

Figure 6:
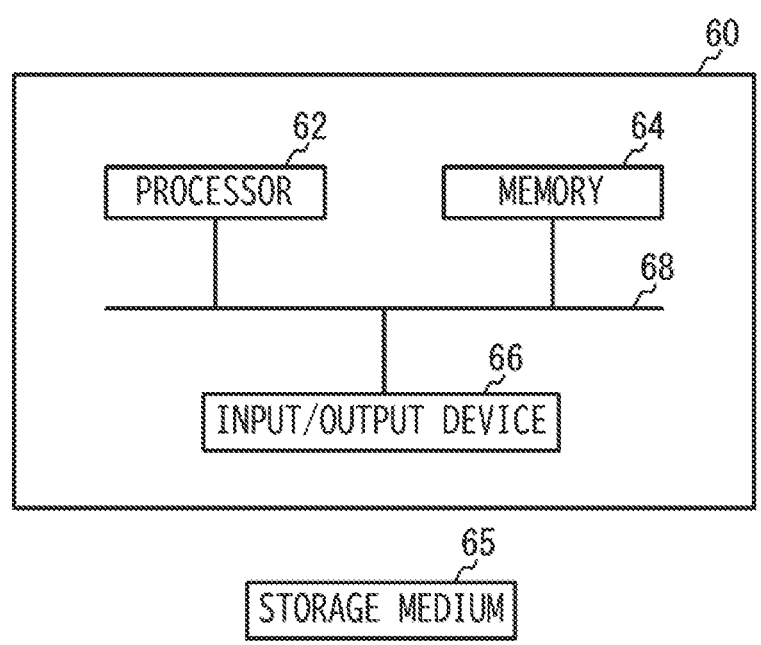
FIG. 6 is a block diagram of a computer according to the first embodiment.

FIG. 6 is a block diagram of the computer according to the first embodiment. A computer 60 functions as the calculation device for calculating the high frequency characteristics of the unit cell 30 in cooperation with software. The computer 60 executes a calculation program for calculating the high frequency characteristics of the unit cell 30, and executes a calculation method for calculating the high frequency characteristics of the unit cell 30.

The computer 60 includes a processor 62, a memory 64, an input/output device 66, and an internal bus 68. The processor 62 is, for example, a CPU (Central Processing Unit) and executes the calculation program and the calculation method. The memory 64 is, for example, a volatile memory or a nonvolatile memory, and stores data and the like used when the processor 62 executes the calculation program and the calculation method. The memory 64 may store the calculation program executed by the processor 62. The input/output device 66 inputs data acquired by the processor 62 from an external device and outputs data output by the processor 62 to the external device. The internal bus 68 connects the processor 62, the memory 64 and the input/output device 66 with each other, and transmits data and the like. The calculation program is stored in a storage medium 65. The storage medium 65 is, for example, a non-temporary tangible medium such as a CD-ROM or a DVD.

[Equivalent Circuit of Unit Cell]

Figure 7:
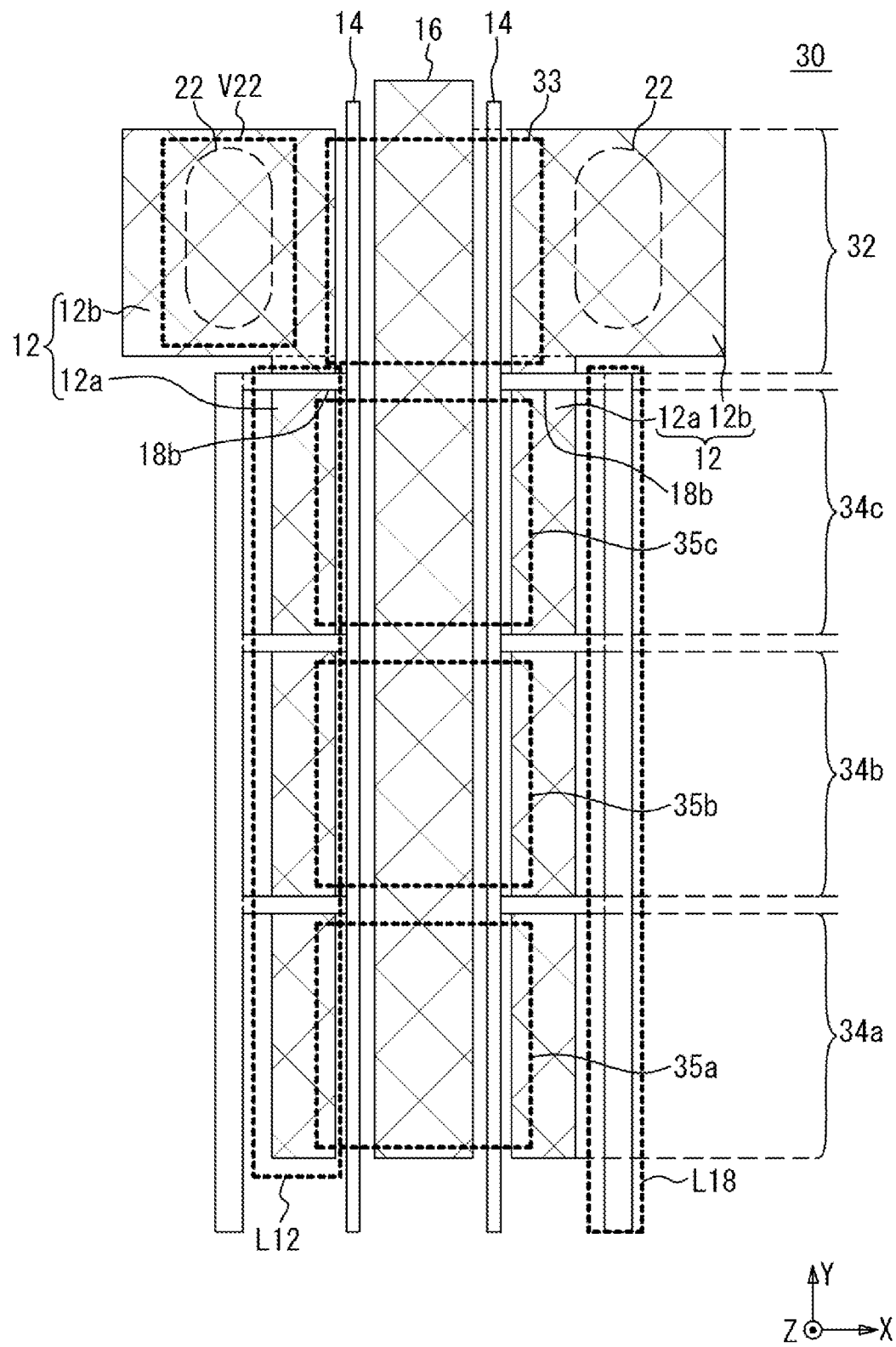
FIG. 7 is a plan view of a unit cell according to the first embodiment.

FIG. 7 is a plan view of the unit cell according to the first embodiment. The unit cell 30 can be decomposed into FETs 35a to 35c and 33, a via hole V22, and distributed constant lines L12 and L18. The FETs 35 a, 35b and 35c correspond to the FETs in the regions 34a, 34b and 34c, respectively. The FET 33 corresponds to the FET in region 32. The via hole V22 corresponds to the metal layer 28a in the via hole 22. The distributed constant line L12 corresponds to the source electrode 12a in the region 34. The distributed constant line L18 corresponds to the wiring 18a in the region 34.

Figure 8:
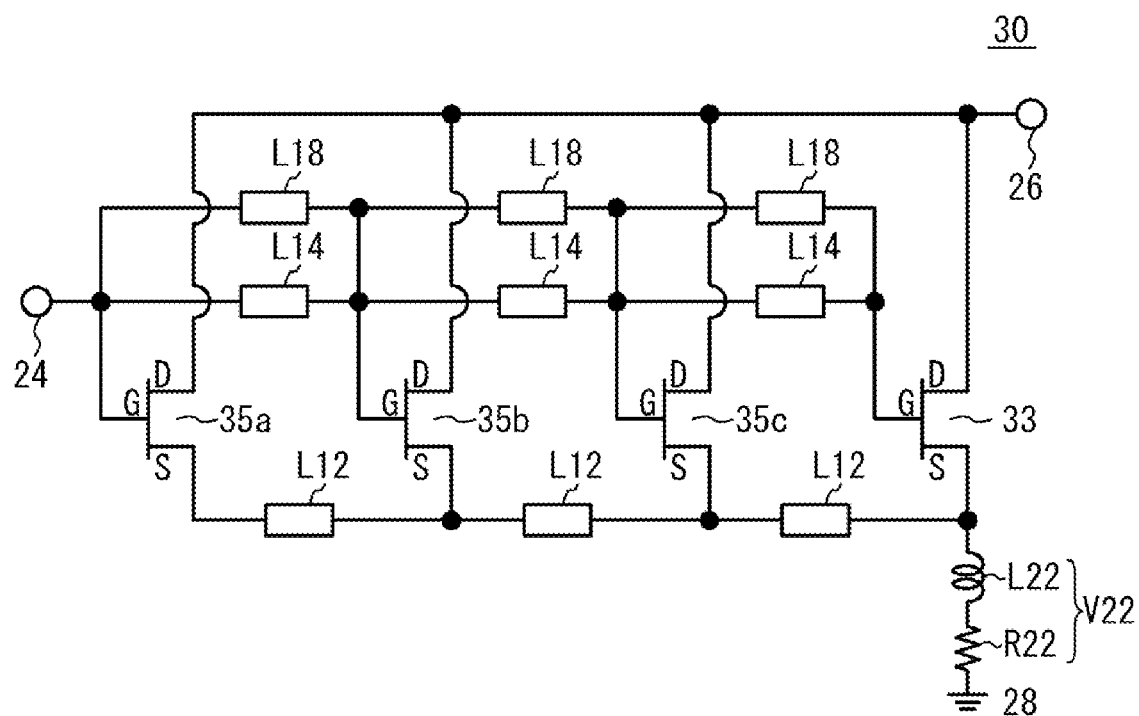
FIG. 8 is a circuit diagram illustrating an equivalent circuit of the unit cell according to the first embodiment.

FIG. 8 is a circuit diagram illustrating an equivalent circuit of the unit cell according to the first embodiment. As illustrated in FIG. 8, the unit cell 30 includes FETs 35 a, 35b, 35c, and 33. Sources S of the plurality of FETs 35 a, 35b, 35c and 33 are electrically connected in common to the metal layer 28 serving as the reference potential. Gates G of the plurality of FETs 35a, 35b, 35c and 33 are electrically connected in common to the gate bus bar 24. Drains D of the plurality of FETs 35a, 35b, 35c and 33 are electrically connected in common to the drain bus bar 26.

The distributed constant lines L14 are connected between the gate bus bar 24 and the gate G of the FET 35b, between the gate G of the FET 35b and the gate G of the FET 35c, and between the gate G of the FET 35c and the gate G of the FET 33, respectively. The distributed constant line L14 corresponds to the gate electrode 14. Since the gate electrode 14 is thin, the distributed constant line L14 is provided when the high frequency characteristics as a line path cannot be ignored. The distributed constant line L14 may not be provided.

The distributed constant lines L18 are connected in parallel to the distributed constant lines L14. The distributed constant line L18 corresponds to the wiring 18a. The distributed constant lines L12 are connected between the source S of the FET 35a and the source S of the FET 35b, between the source S of the FET 35b and the source S of the FET 35c, and between the source S of the FET 35c and the source S of the FET 33, respectively. The distributed constant line L12 corresponds to the source electrode 12a. An inductor L22 and a resistor R22 are connected in series between the source S of the FET 33 and the metal layer 28. The inductor L22 and the resistor R22 correspond to the via hole V22.

In the first embodiment, the high frequency characteristics of the FETs 35a to 35c and 33 are measured by using a measurement pattern having a symmetrical launcher. The high frequency characteristics of the via hole V22 and the distributed constant lines L12 and L18 are calculated by simulation such as electromagnetic field analysis.

[Method of Calculating High Frequency Characteristics]

Figure 9:
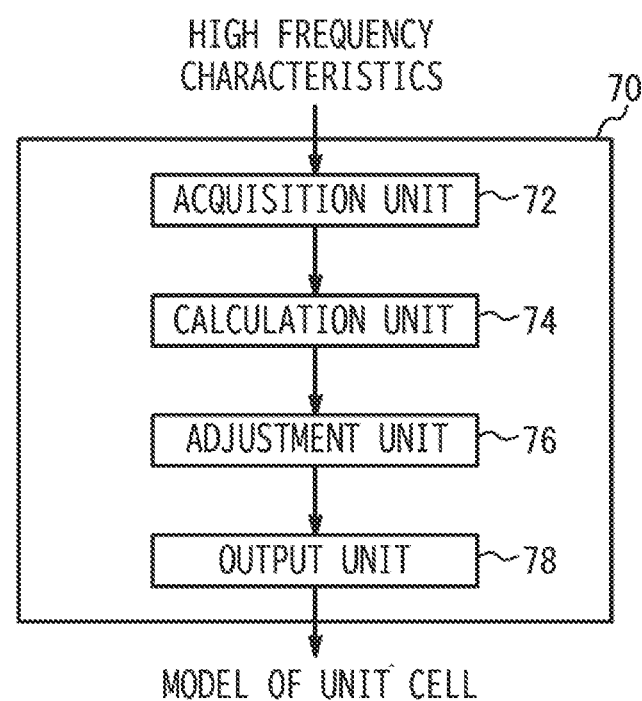
FIG. 9 is a functional block diagram of the calculation device according to the first embodiment.

FIG. 9 is a functional block diagram of the calculation device according to the first embodiment. As illustrated in FIG. 9, a calculation device 70 includes an acquisition unit 72, a calculation unit 74, an adjustment unit 76, and an output unit 78. The computer 60 cooperates with software and functions as the acquisition unit 72, the calculation unit 74, the adjustment unit 76, and the output unit 78.

Figure 10:
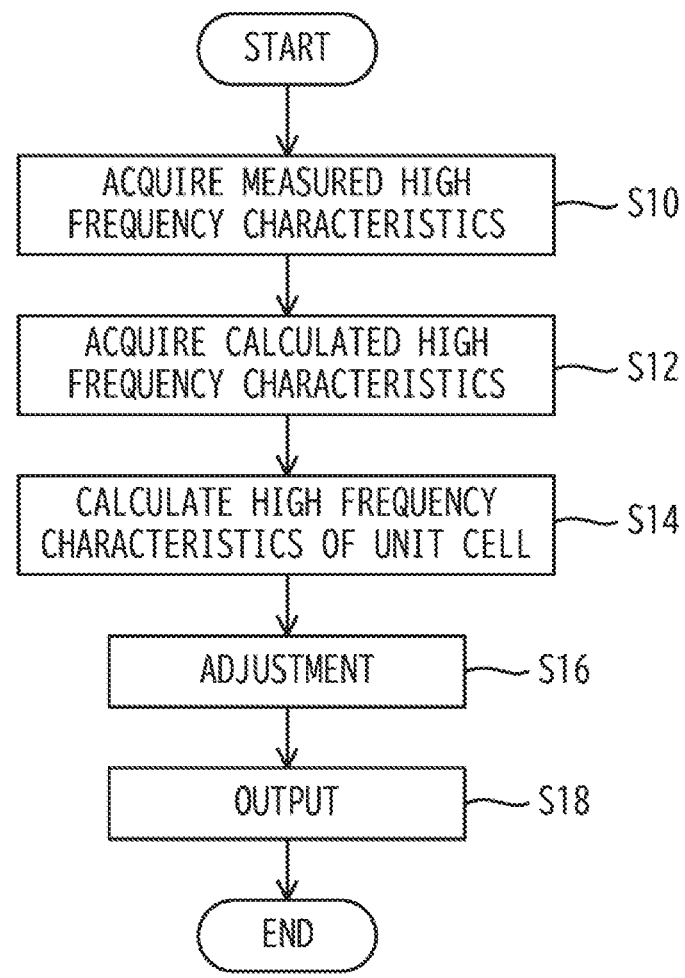
FIG. 10 is a flowchart illustrating a calculation method for calculating the high frequency characteristics of the unit cell according to the first embodiment.

FIG. 10 is a flowchart illustrating a calculation method for calculating the high frequency characteristics of the unit cell according to the first embodiment. As illustrated in FIG. 10, the processor 62 (acquisition unit 72) acquires the high frequency characteristics of the FET measured by using the symmetric launcher from an external device via the input/output device 66 (step S10). The high frequency characteristics of the FET include, for example, the high frequency characteristics of the FETs 35a to 35c and 33. The processor 62 (acquisition unit 72) acquires the high frequency characteristics of the via hole V22 and the distributed constant lines L12 and L18 calculated in the simulation via the input/output device 66 (step S12).

The processor 62 (calculation unit 74) calculates the high frequency characteristics of the unit cell 30 based on the acquired high frequency characteristics of the FET, the via hole V22, and the distributed constant lines L12 and L18 (step S14). Thus, a model representing the high frequency characteristics of the unit cell 30 is calculated. The processor 62 (adjustment unit 76) adjusts the calculated high frequency characteristics of the unit cell 30 using the high frequency characteristics of the unit cell 30 measured by using an asymmetric launcher (step S16). Step S16 may not be performed. The processor 62 (output unit 78) outputs the calculated high frequency characteristics (model) of the unit cell 30 to the external device via the input/output device 66 (step S18). Then, the calculation method ends.

[Example of Step S10]

Figure 11:
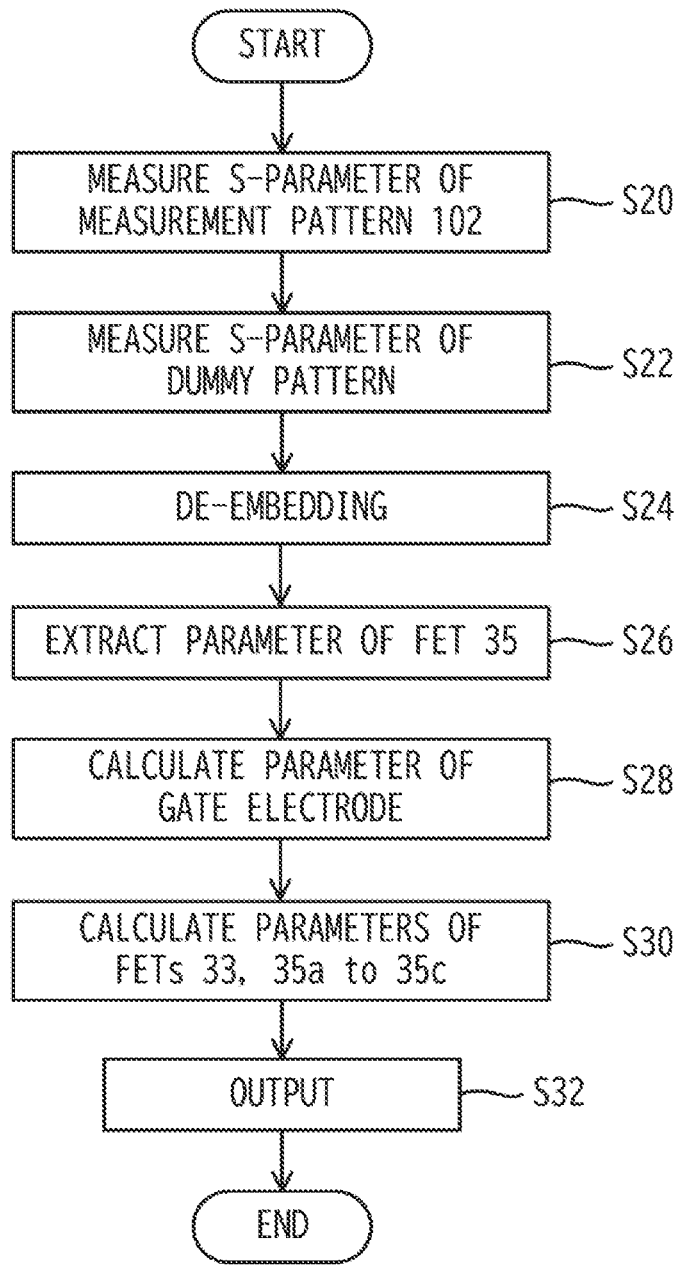
FIG. 11 is a flowchart illustrating an example of a method for measuring and calculating high frequency characteristics of the FET acquired by a computer in step S10 of FIG. 10.

FIG. 11 is a flowchart illustrating an example of a method for measuring and calculating the high frequency characteristics of the FET acquired by the computer in step S10 of FIG. 10. The processing of FIG. 11 may be performed by a human or by the processor 62 of the computer 60.

As illustrated in FIG. 11, the S (scattering) parameter of the FET 35 is measured by using a measurement pattern 102 (step S20).

[Example of Measurement Pattern]

Figure 12:
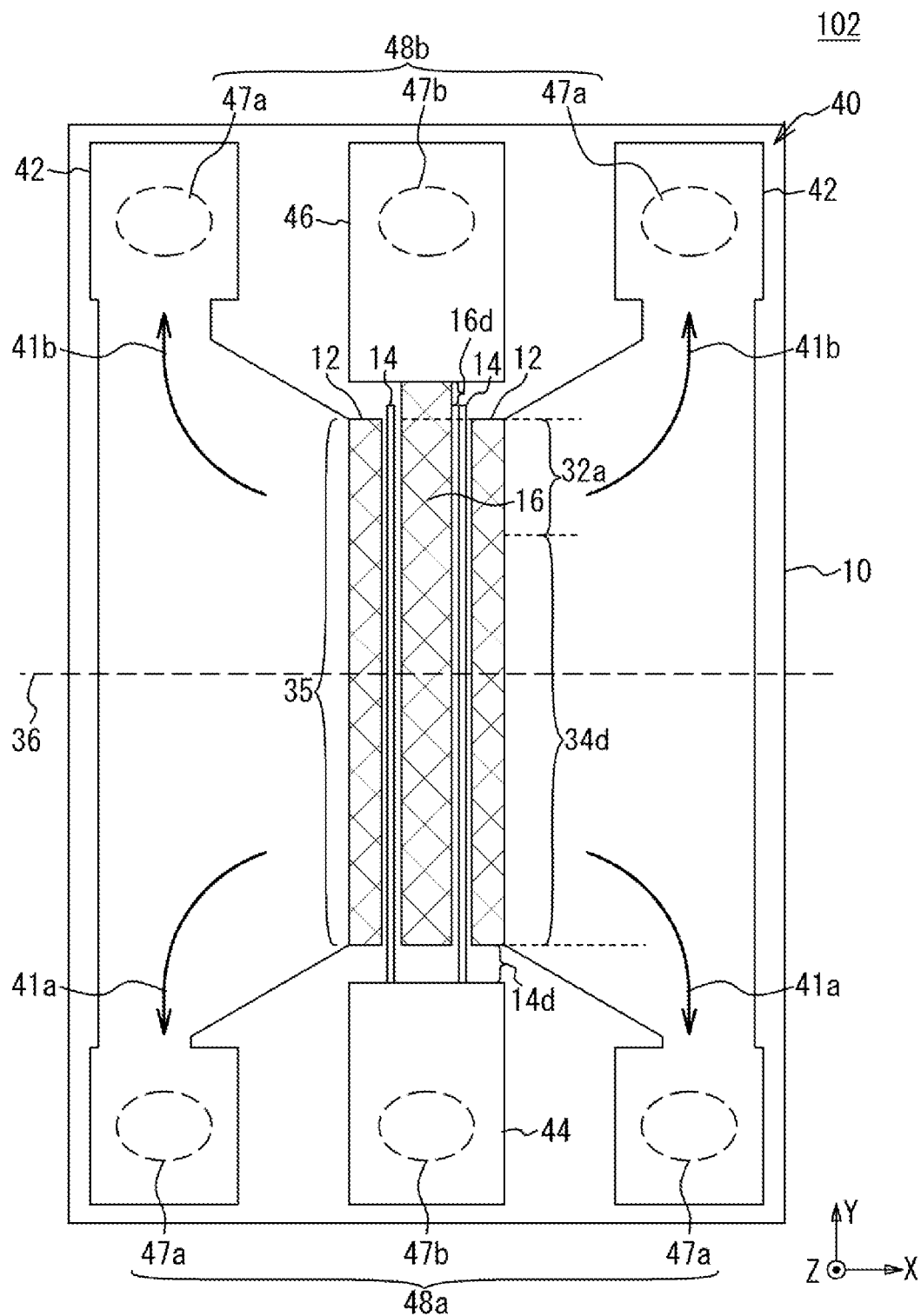
FIG. 12 is a plan view of a measurement pattern according to the first embodiment.

FIG. 12 is a plan view of the measurement pattern according to the first embodiment. The measurement pattern 102 illustrated in FIG. 12 is a measurement pattern for measuring the high frequency characteristics of the FET 35.

The measurement pattern 102 includes the FET 35 and the launcher 40 provided on the substrate 10. The FET 35 corresponds to an FET acquired by combining the FETs 35a to 35c and 33 of the unit cell 30 in FIG. 7. The gate electrode 14 and the drain electrode 16 in the FET 35 have the same configuration as the gate electrode 14 and the drain electrode 16 of the unit cell 30. That is, the planar shape, the thickness and the material of the gate electrode 14 and the drain electrode 16 in the FET 35 are the same as the planar shape, the thickness and the material of the gate electrode 14 and the drain electrode 16 in the unit cell 30, respectively.

The thickness and the material of the source electrode 12 in the FET 35 are the same as those of the source electrode 12 in the unit cell 30, respectively. The width of the source electrode 12 of the FET 35 in the X direction is uniform in the Y direction. Thus, when the center line of the FET 35 and the launcher 40 in the Y direction is defined as the virtual straight line 36, the source electrode 12 is linearly symmetric with respect to the virtual straight line 36. The FET 35 is provided with regions 32a and 34d corresponding to the regions 32 and 34 in the unit cell 30.

The input pad 44 of the launcher 40 is provided in the negative direction (− direction) of the Y direction of the FET 35, and the gate electrode 14 of the FET 35 is electrically connected to the input pad 44. The length of the connecting portion 14d of the gate electrode 14 between the FET 35 and the input pad 44 in the Y direction is the same as the length of the connecting portion 14d of the unit cell 30 in the Y direction.

The output pad 46 of the launcher 40 is provided in the positive direction (+ direction) of the Y direction of the FET 35, and the drain electrode 16 of the FET 35 is electrically connected to the output pad 46. The length of the connecting portion 16d of the drain electrode 16 between the FET 35 and the output pad 46 in the Y direction is the same as the length of the connecting portion 16d of the unit cell 30 in the Y direction.

A pair of reference pads 42 of the launcher 40 are provided so as to dispose the FET 35 between the pair of reference pads 42 in the X direction. The reference pads 42 are provided so as to be connected to all of the source electrodes 12 of the FET 35 when viewed from the X direction. The reference pads 42 are provided symmetrically with respect to the virtual straight line 36.

Similarly to FIG. 5, the high frequency probe 48a having the ground probes 47a and the signal probe 47b is in contact with the vicinity of the negative ends (− ends) in the Y direction of the pair of reference pads 42 and input pads 44. The high frequency probe 48b having the ground probes 47a and the signal probe 47b is in contact with the vicinity of the positive ends (+ ends) in the Y direction of the pair of reference pads 42 and output pads 46. The high frequency probes 48a and 48b are coplanar probes in which the signal probe 47b is disposed between the ground probes 47a.

In the measurement pattern 102, since the reference pad 42 is linearly symmetric with respect to the virtual straight line 36, the current return paths 41a extending from the FET 35 toward the input pad 44 and the current return paths 41b extending from the FET 35 toward the output pad 46 are symmetric with each other. Therefore, the de-embedding of the launcher 40 can be performed with high accuracy by using the open-short method.

[Equivalent Circuit of FET 35]

Figure 13:
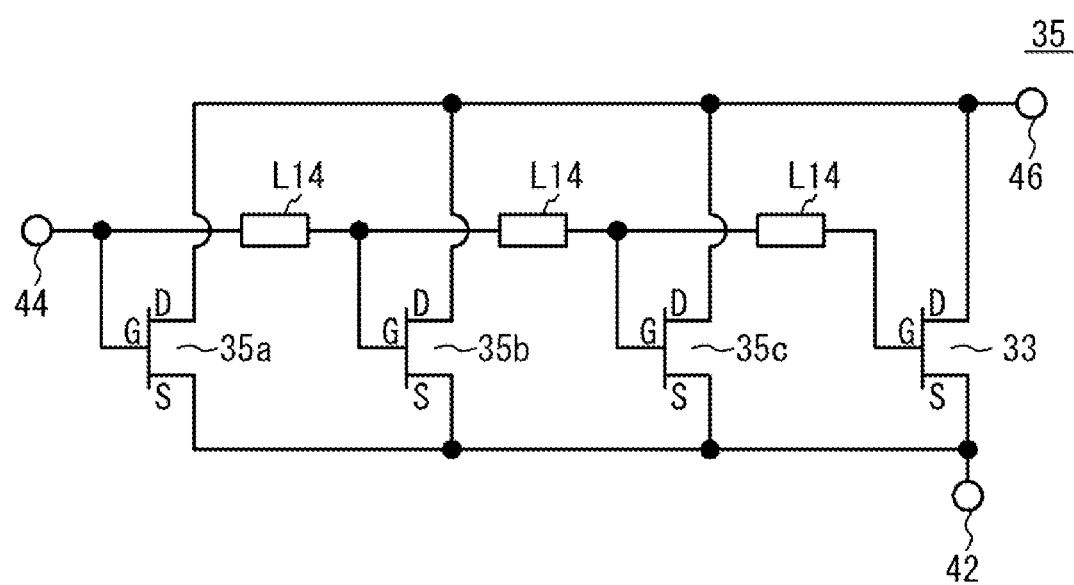
FIG. 13 is a circuit diagram illustrating an equivalent circuit of an FET 35.

An equivalent circuit for modeling the FET 35 will be described. FIG. 13 is a circuit diagram illustrating an equivalent circuit of the FET 35. As illustrated in FIG. 13, the FET 35 includes FETs 35a, 35b, 35c, and 33 in the unit cell 30.

The sources S of the plurality of FETs 35a, 35b, 35c and 33 are electrically connected in common to the reference pad 42. The gates G of the plurality of FETs 35a, 35b, 35c and 33 are electrically connected in common to the input pad 44. The drains D of the plurality of FETs 35a, 35b, 35c and 33 are electrically connected in common to the output pad 46.

The distributed constant line L14 are connected between the input pad 44 and the gate G of the FET 35b, between the gate G of the FET 35b and the gate G of the FET 35c, and between the gate G of the FET 35c and the gate G of the FET 33, respectively.

Returning to FIG. 11, the S-parameter measured in step S20 is, for example, a S-parameter using a small signal (i.e., a high frequency signal having a small amplitude). When the input pad 44 is designated as a port 1 and the output pad 46 is designated as a port 2, the S-parameter is S11, S12, S21 and S22. The S-parameter is measured by using, for example, a network analyzer. The S-parameter to be measured is performed for a plurality of frequencies including the operating band of the FET 100. For example, when the FET 100 is used for a power amplifier (power amplifier) for wireless communication, the operating band is any one of a band from 0.5 GHz to 10 GHz. The S parameter is measured at the plurality of frequencies by sweeping from a frequency fmin sufficiently lower than the operating band to a frequency fmax greater than the operating band. Assuming a voltage set (Vgs, Vds) of the gate voltage Vgs and the drain voltage Vds, the S-parameter is measured by sweeping the frequency from fmin to fmax for a plurality of voltage sets (Vgs, Vds). The plurality of voltage sets may be, for example, voltage sets in the vicinity of a load line in a large signal (i.e., a high frequency signal having a large amplitude). In step S20, a current-voltage characteristic may be acquired. The current-voltage characteristic is, for example, a drain current Ida-drain voltage Vds characteristic.

The S-parameter is measured by using the dummy pattern (step S22). The dummy patterns are, for example, an open pattern of only the launcher 40 without the FET 35 in FIG. 12, and a short pattern in which the same metal layer as the launcher 40 is provided instead of the FET 35. For the open pattern and the short pattern, the S-parameter is measured at the frequencies swept from fmin to fmax.

The S-parameter of the measurement pattern 102 measured in step S20 is de-embedded by using the S-parameter of the dummy pattern measured in step S22 (step S24). Thus, the S-parameter of the FET 35 can be calculated. The calculated high frequency characteristic of the FET 35 is, for example, the S-parameter acquired by sweeping the frequency from fmin to fmax for the plurality of voltage sets (Vgs, Vds).

Thereafter, the parameter of the FET 35 is extracted using the high frequency characteristics (S-parameter) calculated in step S24 (step S26). For example, for each voltage set (Vgs, Vds), an equivalent circuit parameter is extracted using the S-parameter acquired by sweeping the frequency. The equivalent circuit parameter is, for example, a gate-source capacitance Cgs, a gate-drain capacitance Cgd, a drain-source capacitance Cds, a gate resistance Ri, and a mutual conductance gm. The equivalent circuit parameter in each voltage set is used to extract the parameter of the large signal model of the FET 35. The large signal model is, for example, an Angelov model.

A parameter of the distributed constant line L14 corresponding to the gate electrode 14 is calculated (step S28). The parameter of the distributed constant line L14 is calculated by the electromagnetic field analysis, for example. The parameter of the distributed constant line L14 to be calculated is, for example, a parameter of the transmission line, such as the length and width of the signal line of the transmission line, the dielectric constant of the dielectric surrounding the signal line, and the like. The parameter of the distributed constant line L14 to be calculated may be an S-parameter.

Parameters of the FETs 35a to 35c and 33 are calculated (step S30). The parameters of the FETs 35a to 35c and 33 are calculated using the parameter of the FET 35 calculated in step S26 and the parameter of the distributed constant line L14 calculated in step S28. For example, in the equivalent circuit of FIG. 13, the parameters of the FETs 35a to 35c and 33 are assumed. At this time, if the gate widths of the FETs 35a to 35c and 33 are the same as each other, the parameters of the FETs 35 a to 35c and 33 are the same as each other. When the gate widths of the FETs 35a to 35c and 33 are different from each other, the parameters of the FETs 35a to 35c and 33 are scaled according to the gate width.

The parameter of the FET 35 is calculated using the calculated parameter of the distributed constant line L14 and the assumed parameters of the FETs 35a to 35c and 33. The parameters of the FETs 35a to 35c and 33 are fitted so that the parameter of the FET 35 becomes the parameter calculated in step S26. Thus, the parameters of the FETs 35a to 35c and 33 can be calculated. The parameters of the FETs 35a to 35c and 33 are parameters of the large signal model of the FETs 35a to 35c and 33, for example.

The calculated parameters of the FETs 35a to 35c and 33 are output (step S32). For example, in step S10 of FIG. 10, the processor 62 acquires the calculated parameters of the FETs 35a to 35c and 33.

The parameter of the FET acquired by the processor 62 in step S10 of FIG. 10 may be the parameter of the FET 35 calculated in step S26. In this case, in step S14, the processor 62 calculates the parameters of the FETs 35a to 35c and 33 of step S30.

[Example of Step S12]

In step S12, the high frequency characteristics of the via hole V22 acquired by the processor 62 are parameters of the via hole V22 calculated, for example, from the three-dimensional structure of the via hole V22 using the electromagnetic field analysis. The parameter of the via hole V22 is, for example, a resistance value of the resistor R22 connected in series and an inductance of the inductor L22. The high frequency characteristics of the distributed constant lines L12 and L18 acquired by the processor 62 are, for example, parameters of the distributed constant lines L12 and L18 calculated from the three-dimensional structure of the distributed constant lines L12 and L18 using the electromagnetic field analysis. The parameters of the distributed constant lines L12 and L18 are parameters of the transmission line, such as the length and width of the signal line of the transmission line, the dielectric constant of the dielectric material surrounding the signal line, and the like. The parameters of the distributed constant lines L12 and L18 to be calculated may be S-parameters.

[Example of Step S14]

In step S14, the processor 62 combines the high frequency characteristics of the FETs 35 a to 35c and 33 acquired in step S10 and the high frequency characteristics of the via hole V22 and the distributed constant lines L12 and L18 acquired in step S12 to generate a high frequency model of the unit cell 30. For example, the parameters of the FETs 35a to 35c and 33, the parameters of the via hole V22 and the distributed constant lines L12, L14 and L18 are used as the FETs 35a to 35c and 33, the via hole V22 and the distributed constant lines L12 and L18 of the equivalent circuit in FIG. 8, thereby generating a model for the high frequency signal of the unit cell 30.

The high frequency characteristics of the unit cell 30 calculated in step S14 include, for example, the parameters of the FETs 35a to 35c and 33, the parameters of the via hole V22, and the parameters of the distributed constant lines L12, L14 and L18. The high frequency characteristics of the unit cell 30 may be an S-parameter.

[Example of Step S16]

Figure 14:
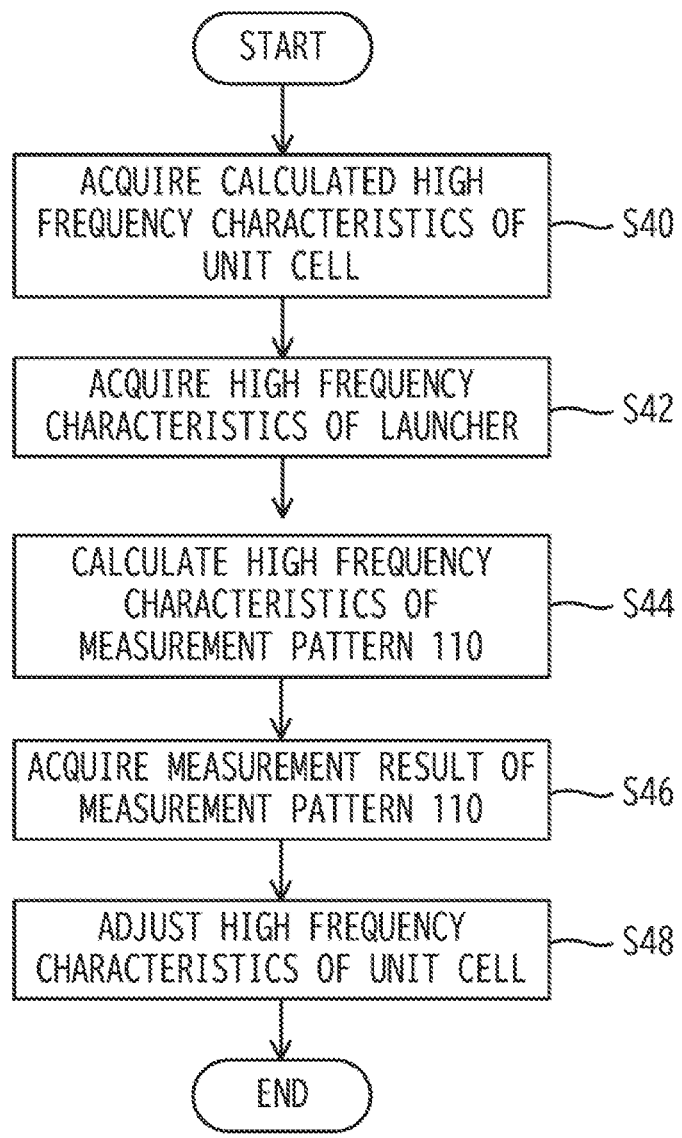
FIG. 14 is a flowchart illustrating a method of adjustment in step S16 of FIG. 10.

FIG. 14 is a flowchart illustrating a method of adjustment in step S16 of FIG. 10. As illustrated in FIG. 14, the processor 62 acquires the high frequency characteristics of the unit cell 30 calculated in step S14 (step S40). The processor 62 acquires the high frequency characteristics of the asymmetric launcher 40 illustrated in FIG. 5 (step S42). The high frequency characteristics of the launcher 40 are, for example, an S-parameter, and may be measured by using the dummy pattern or calculated by using the electromagnetic field analysis.

The processor 62 calculates the high frequency characteristics of the measurement pattern 110 (see FIG. 5) using the high frequency characteristics of the unit cell 30 acquired in step S40 and the high frequency characteristics of the launcher 40 acquired in step S42 (step S44). The high frequency characteristics of the measurement pattern 110 to be calculated are characteristics of a small signal model and characteristics of a large signal model, for example.

The high frequency characteristics of the measurement pattern 110 are measured. The processor 62 acquires the high frequency characteristics of the measurement pattern 110 (step S46). The high frequency characteristics of the measurement pattern 110 to be acquired are the characteristics of the small signal model and the characteristics of the large signal model, for example.

The processor 62 adjusts the high frequency characteristics of the unit cell 30 based on the high frequency characteristics of the measurement pattern 110 calculated in step S44 and the high frequency characteristics of the measurement pattern 110 acquired in step S46 (step S48). For example, the processor 62 adjusts the high frequency characteristics of the unit cell 30 so that the difference between the high frequency characteristics of the measurement pattern 110 calculated in step S44 and the high frequency characteristics of the measurement pattern 110 acquired in step S46 becomes small.

Thus, the high frequency characteristics of the unit cell 30 can be calculated. That is, the model for the high frequency signal of the unit cell 30 is generated.

First Variation of First Embodiment

In a first variation of the first embodiment, a measurement pattern 104 of the FET 33 and a measurement pattern 106 of an FET 35d including the FETs 35a to 35c are used instead of the measurement pattern 102 of the FET 35 of the first embodiment. The configuration of the unit cell 30 and the flowchart of FIG. 10 for calculating the high frequency characteristics of the unit cell 30 are the same as those of the first embodiment.

Example 1 of Measurement Pattern

Figure 15:
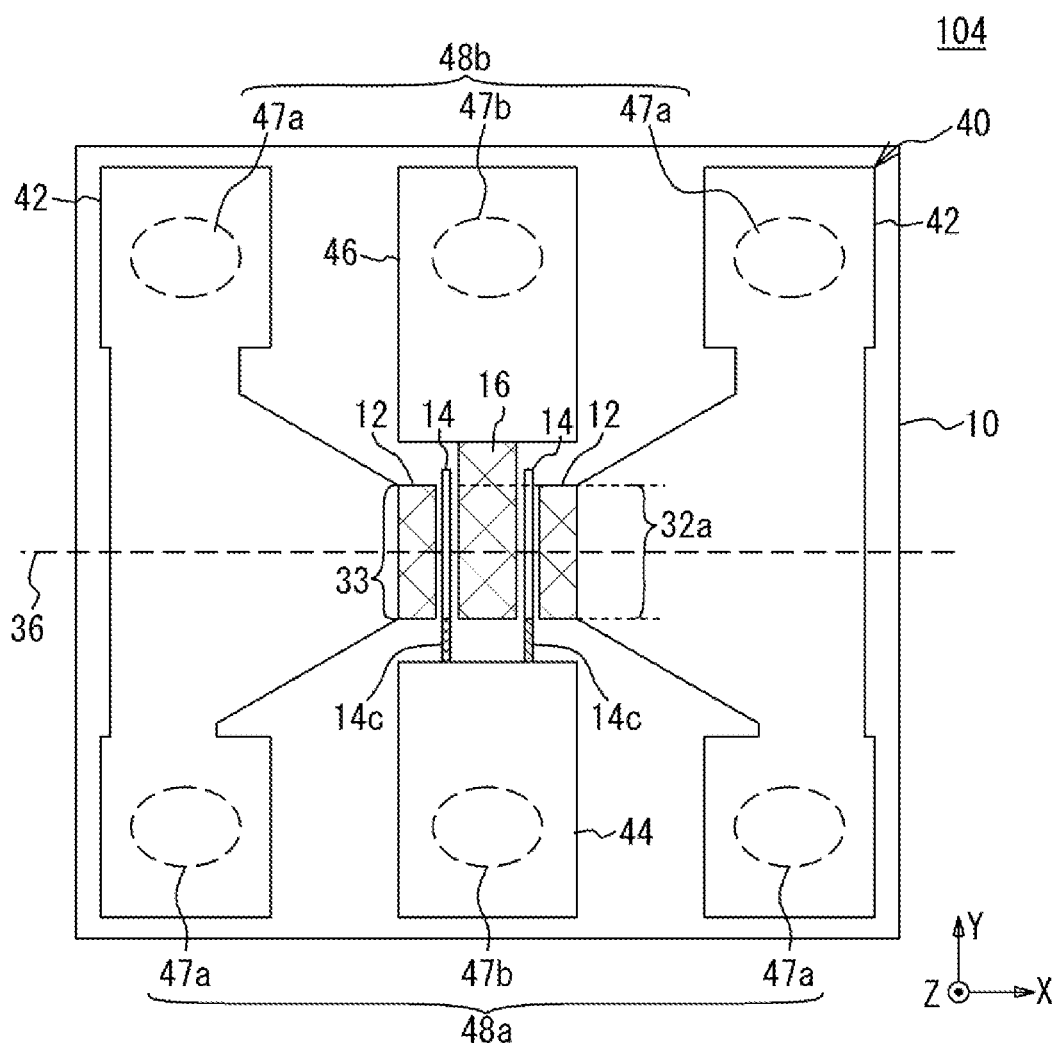
FIG. 15 is a plan view of a measurement pattern according to a first variation of the first embodiment.

FIG. 15 is a plan view of a measurement pattern according to the first variation of the first embodiment. As illustrated in FIG. 15, the measurement pattern 104 is a measurement pattern for measuring the high frequency characteristics of the FET 33. The measurement pattern 104 includes the FET 33 and the launcher 40 provided on the substrate 10. The FET 33 corresponds to the FET in the region 32a of the measurement pattern 102 of FIG. 12. The source electrodes 12 and the drain electrode 16 of the FET 33 are electrically connected to the reference pads 42 and the output pad 46, respectively. The gate electrodes 14 of the FET 33 are electrically connected to the input pad 44 through lines 14c. In the unit cell 30, as illustrated in FIG. 7, the gate electrodes 14 of the FET 33 are directly connected to the gate electrodes 14 of the FET 35c. In the measurement pattern 104, since the gate electrodes 14 of the FET 33 cannot be directly connected to the input pad 44, the lines 14c are provided. The other configuration of the measurement pattern 104 is the same as that of the measurement pattern 102, and description thereof is omitted.

Example 2 of Measurement Pattern

Figure 16:
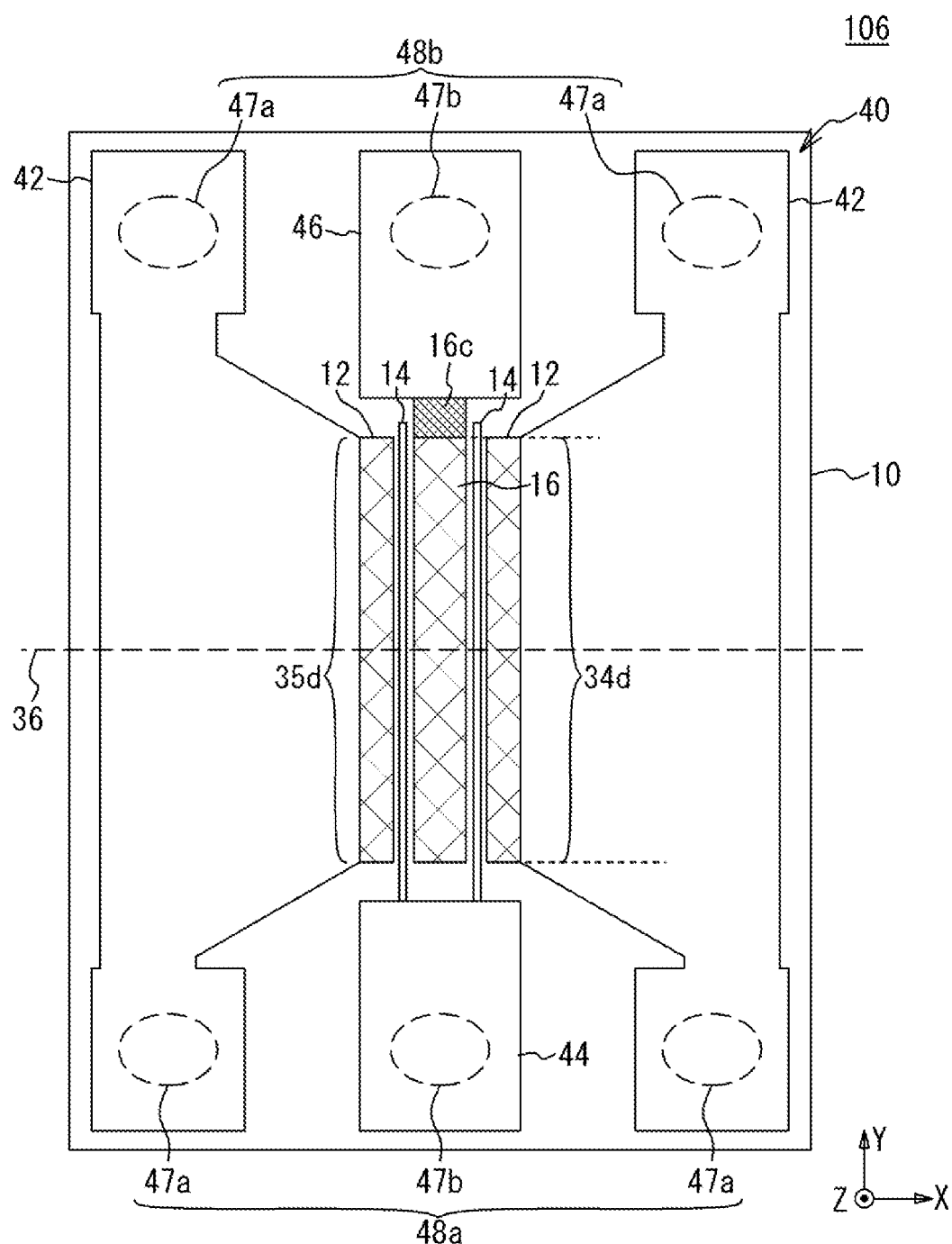
FIG. 16 is a plan view of a measurement pattern according to the first variation of the first embodiment.

FIG. 16 is a plan view of a measurement pattern according to the first variation of the first embodiment. As illustrated in FIG. 16, the measurement pattern 106 is a measurement pattern for measuring the high frequency characteristics of the FET 35d. The measurement pattern 106 includes the FET 35d and the launcher 40 provided on the substrate 10. The FET 35d corresponds to the FET in the region 34d of the measurement pattern 102 of FIG. 12, and is an FET acquired by combining the FETs 35 a to 35c. The source electrodes 12 and the gate electrodes 14 of the FET 35d are electrically connected to reference pads 42 and the input pad 44, respectively. The drain electrode 16 of the FET 35d is electrically connected to the output pad 46 by a line 16c. In the measurement pattern 106, since the drain electrode 16 of the FET 35d and the output pad 46 cannot be directly connected, the line 16c is provided. The other configuration of the measurement pattern 106 is the same as that of the measurement pattern 102, and description thereof is omitted.

In the measurement patterns 104 and 106, the launcher 40 is linearly symmetric with respect to the virtual straight line 36. Therefore, the de-embedding of the launcher 40 can be performed with high accuracy by using the open-short method.

[Equivalent Circuit of FET 33]

Figure 17:
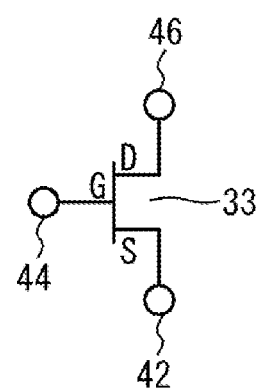
FIG. 17 is a circuit diagram illustrating an equivalent circuit of an FET 33 according to the first variation of the first embodiment.

FIG. 17 is a circuit diagram illustrating an equivalent circuit of the FET 33 according to the first variation of the first embodiment. As illustrated in FIG. 17, the FET 33 corresponds to the FET 33 in the unit cell 30. The reference pad 42 is electrically connected to the source S of the FET 33, the input pad 44 is electrically connected to the gate G of the FET 33, and the output pad 46 is electrically connected to the drain D of the FET 33.

[Equivalent Circuit of FET 35d]

Figure 18:
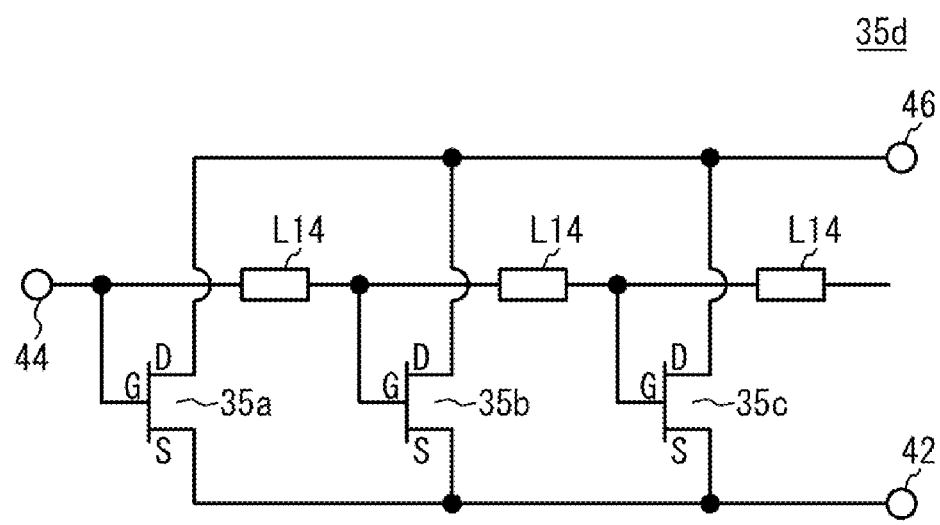
FIG. 18 is a circuit diagram illustrating an equivalent circuit of an FET 35d according to the first variation of the first embodiment.

FIG. 18 is a circuit diagram illustrating an equivalent circuit of the FET 35d according to the first variation of the first embodiment. As illustrated in FIG. 18, the FET 35d includes the FETs 35a, 35b and 35c in the unit cell 30, but does not include the FET 33. The sources S of the plurality of FETs 35a, 35b and 35c are electrically connected in common to the reference pad 42. The input pad 44 is electrically connected in common to the gates G of the plurality of FETs 35a, 35b and 35c. The drains D of the plurality of FETs 35a, 35b and 35c are electrically connected in common to the output pad 46. The other configuration of the equivalent circuit of the FET 35d is the same as that of the equivalent circuit of the FET 35 illustrated in FIG. 13.

[Calculation Method of High Frequency Characteristics of FET 33 and FETs 35a to 35c]

Figure 19:
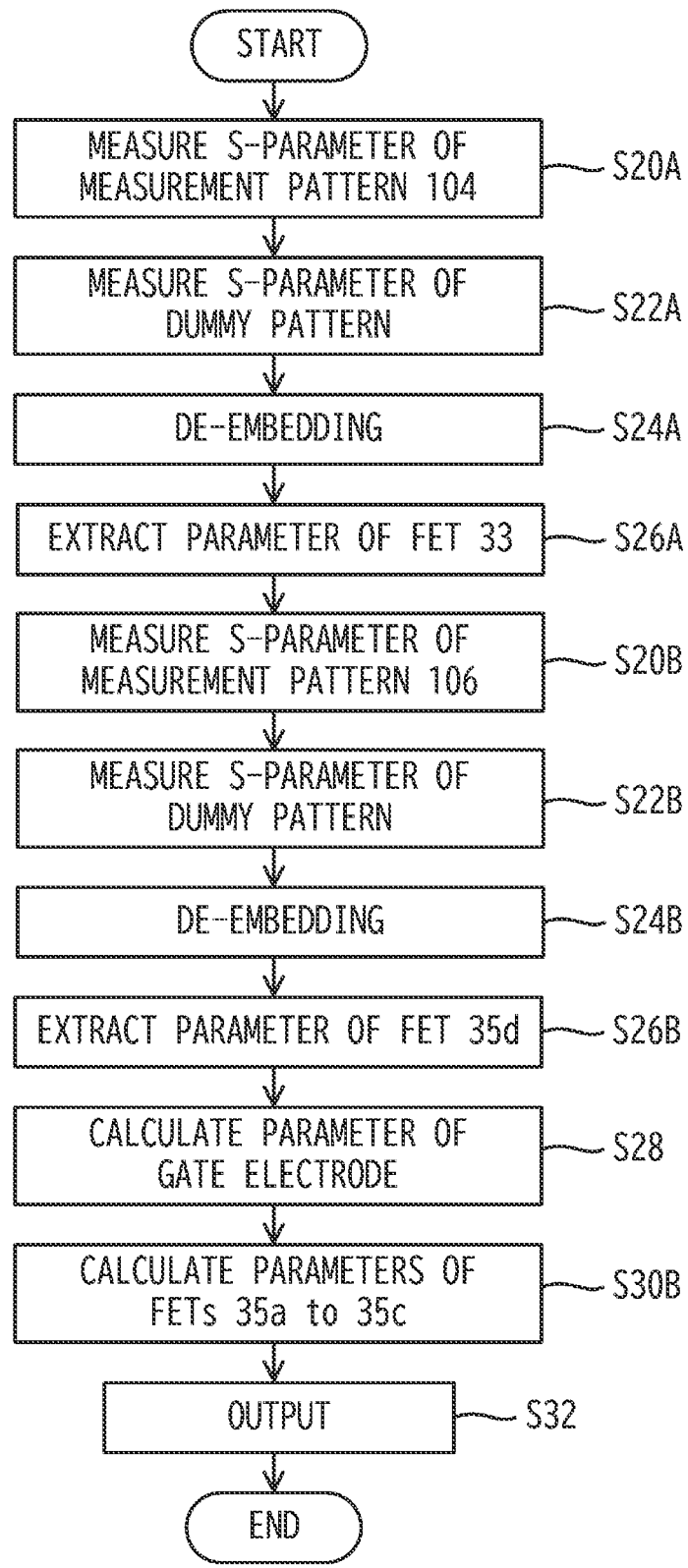
FIG. 19 is a flowchart illustrating an example of a method for measuring and calculating the high frequency characteristics of the FET acquired by the computer in step S10 of FIG. 10 according to the first variation of the first embodiment.

In step S10 of FIG. 10, an example of a method for measuring and calculating the high frequency characteristics of the FET acquired by the computer 60 will be described. FIG. 19 is a flowchart illustrating the example of the method for measuring and calculating the high frequency characteristics of the FET acquired by the computer in step S10 of FIG. 10 according to the first variation of the first embodiment. The process illustrated in FIG. 19 may be performed by the human or the processor 62 of the computer 60.

As illustrated in FIG. 19, the S parameter of the FET 33 is measured by using the measurement pattern 104 (step S20A). For example, for the plurality of voltage sets (Vgs, Vds), the S-parameter is measured by sweeping the frequency from fmin to fmax.

The S-parameter is measured by using the dummy pattern (step S22A). The dummy pattern is, for example, the open pattern and the short pattern. For the open pattern and the short pattern, the S-parameter is measured by sweeping the frequency from fmin to fmax.

The S-parameter of the measurement pattern 104 measured in step 520A is de-embedded by using the S-parameter of the dummy pattern measured in step S22A (step S24A). As the de-embedding, in addition to the de-embedding using the open-short method, de-embedding which removes the influence of the line 14c from the high frequency characteristics of the measurement pattern 104 measured in step 520A may be performed. For de-embedding to remove the influence of the line 14c, the high frequency characteristics of the line 14c measured by using a manganese (Mangan) method or the high frequency characteristics of the line 14c calculated by simulation are used.

A parameter of the FET 33 is extracted using the high frequency characteristic (S-parameter) of the FET 33 calculated in step S24A (step S26A). The extracted parameter of the FET 33 is the parameter of the equivalent circuit and the parameter of the large signal model, for example.

Next, the S-parameter of the FET 35d is measured by using the measurement pattern 106 (step 520B). The S-parameter is measured by using the dummy pattern (step S22B). The S-parameter of the measurement pattern 106 measured in step 520B is de-embedded by using the S-parameter of the dummy pattern measured in step S22B (step S24B). Thus, the S-parameter of the FET 35d can be calculated. Similarly to step S24A, the de-embedding may be performed to remove the influence of the line 16c from the high frequency characteristics of the measurement pattern 106 measured in step 520B.

A parameter of the FET 35d is extracted using the high frequency characteristic (S parameter) of the FET 35d calculated in step S24B (step S26B). The extracted parameter of the FET 35d is the parameter of the equivalent circuit and the parameter of the large signal model, for example.

Similarly to step S28 in FIG. 11, a parameter of the distributed constant line L14 corresponding to the gate electrode 14 is calculated (step S28). Parameters of the respective FETs 35 a to 35c are calculated (step S30B). The method for calculating the parameters of the FETs 35a to 35c is the same as step S30 in FIG. 11. Steps S20B to S30B may be performed prior to steps S20A to S26A.

The parameter of the FET 33 calculated in step S26A and the parameters of the FETs 35 a to 35c calculated in step 530B are output (step S32). In step S10 of FIG. 10, the processor 62 acquires the calculated parameters of the FETs 35a to 35c and 33. Thereafter, the processor 62 performs the processing of steps S12 to S18 of FIG. 10 to generate the model for the high frequency signal of the unit cell 30.

Second Variation of First Embodiment

In a second variation of the first embodiment, measurement patterns of the FETs 35a to 35c are used instead of the measurement pattern 106 of the FET 35d in the first variation of the first embodiment. The configuration of the unit cell 30 and the flowchart of FIG. 10 for calculating the high frequency characteristics of the unit cell 30 are the same as those of the first embodiment.

[Example of Measurement Pattern]

Figure 20:
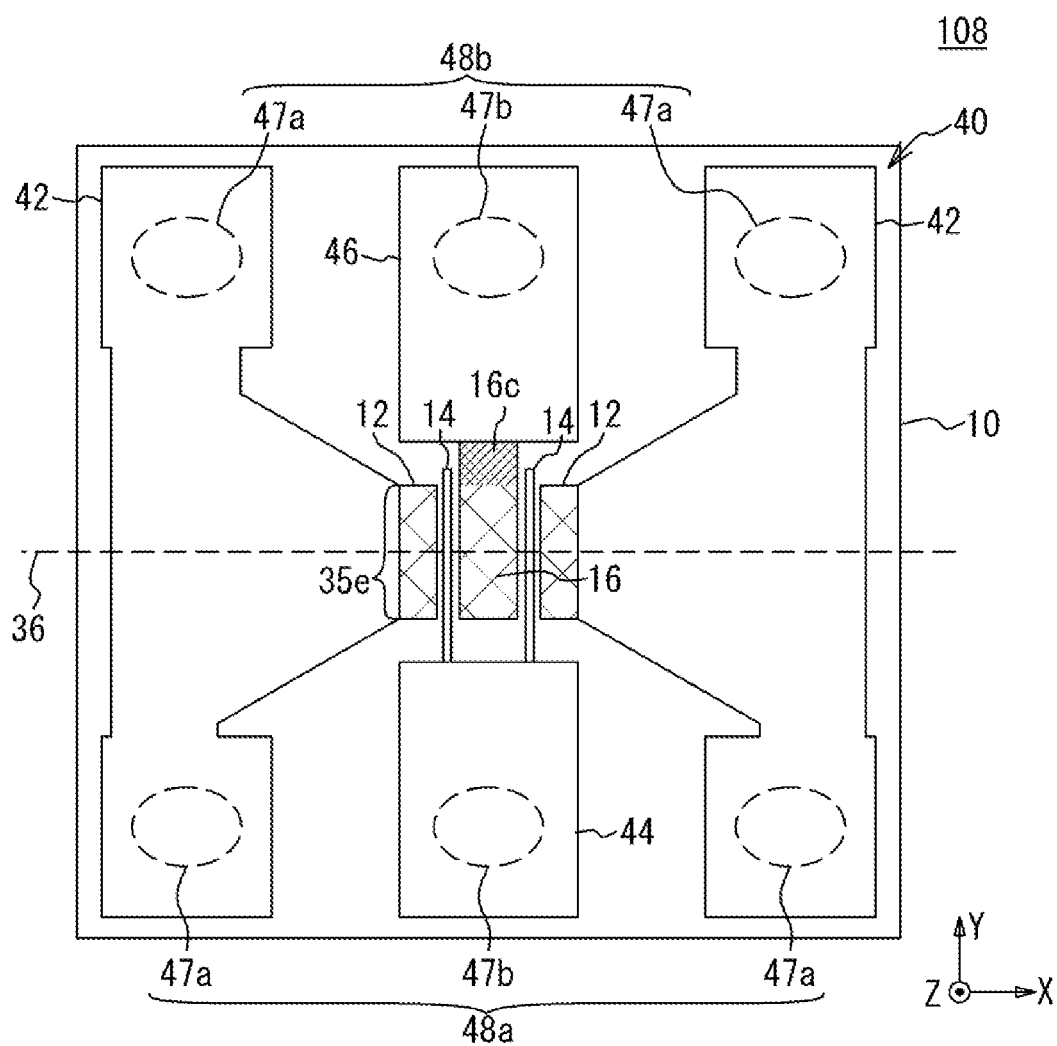
FIG. 20 is a plan view of a measurement pattern according to a second variation of the first embodiment.

FIG. 20 is a plan view of a measurement pattern according to the second variation of the first embodiment. As illustrated in FIG. 20, a measurement pattern 108 is a measurement pattern for measuring the high frequency characteristics of an FET 35e. The measurement pattern 108 includes the FET 35e and the launcher 40 provided on the substrate 10. The FET 35e corresponds to one of the FETs 35a to 35c (see FIG. 7) in the region 34d of the measurement pattern 106 in FIG. 16. The source electrodes 12 and the drain electrode 16 of the FET 35e are electrically connected to the reference pads 42 and the output pad 46, respectively. The gate electrodes 14 of the FET 35e are electrically connected to the input pad 44. The other configuration of the measurement pattern 108 is the same as that of the measurement patterns 104 and 106, and description thereof is omitted.

[Equivalent Circuit of FET 35e]

The equivalent circuit of the FET 35e is the same as that of the FET 33, and the description thereof will be omitted.

[Calculation Method of High Frequency Characteristics of FET 33 and FETs 35a to 35c]

Figure 21:
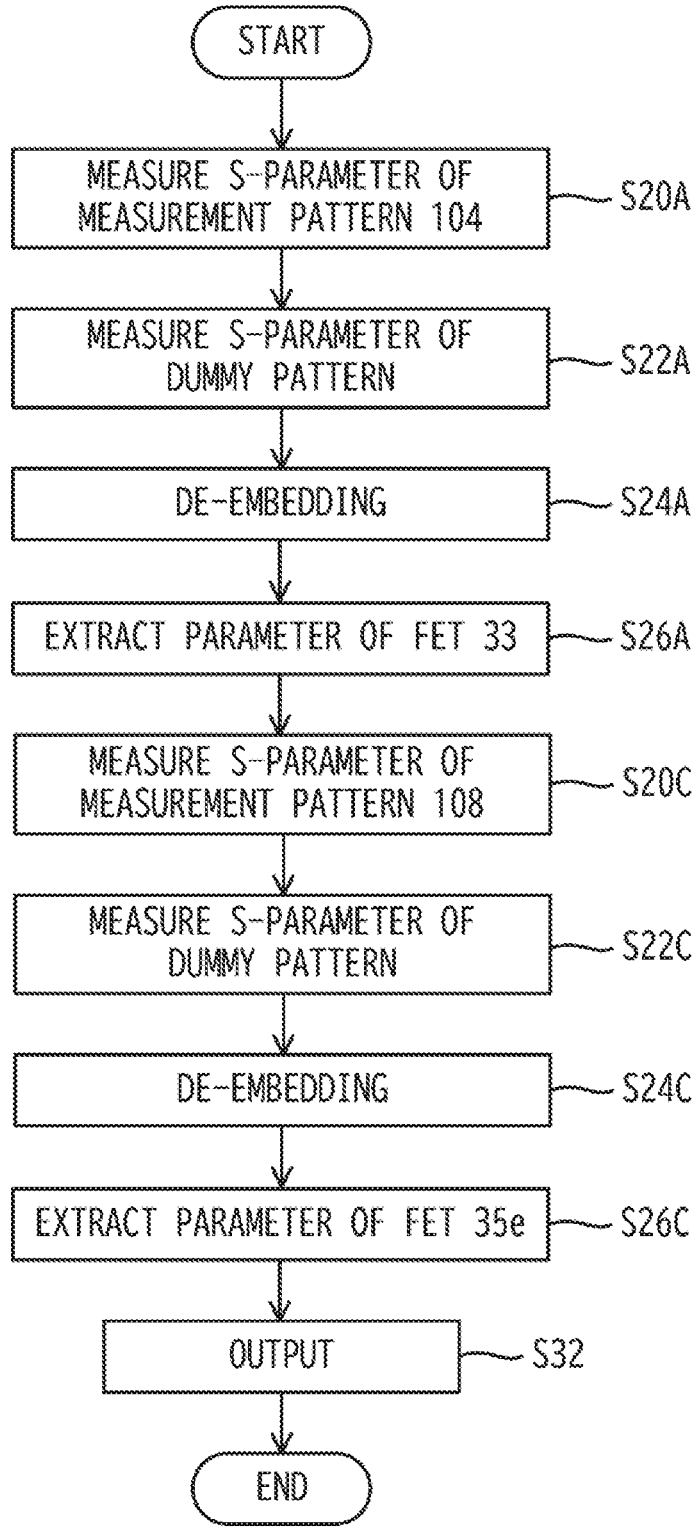
FIG. 21 is a flowchart illustrating an example of a method for measuring and calculating the high frequency characteristics of the FET acquired by the computer in step S10 of FIG. 10 according to the second variation of the first embodiment.

In step S10 of FIG. 10, an example of a method for measuring and calculating the high frequency characteristics of the FET acquired by the computer 60 will be described. FIG. 21 is a flowchart illustrating the example of the method for measuring and calculating the high frequency characteristics of the FET acquired by the computer 60 in step S10 of FIG. 10 according to the second variation of the first embodiment. The processing of FIG. 21 may be performed by the human or by the processor 62 of the computer 60.

As illustrated in FIG. 21, the processing in steps S20A to S26A is the same as that in FIG. 19 of the first variation of the first embodiment. The S-parameter of the FET 35e is measured by using the measurement pattern 108 (step S20C). The S-parameter is measured by using the dummy pattern (step S22C). The S-parameter of the measurement pattern 108 measured in step S20C is de-embedded by using the S-parameter of the dummy pattern measured in step S22C (step S24C). Thus, the S-parameter of the FET 35e can be calculated. The S-parameter of the FET 35e corresponds to the S-parameters of the FETs 35a to 35c. The de-embedding may be performed to remove the influence of the line 16c from the high frequency characteristics of the measurement pattern 108 measured in step S20C.

Each of the parameters of the FETs 35a to 35c is extracted by using the high frequency characteristics (S-parameter) of the FET 35e calculated in step S24C (step S26C). The parameter of the FET 33 calculated in step S26A and the parameters of the FETs 35a to 35c calculated in step S26C are output (step S32).

In step S10 of FIG. 10, the processor 62 acquires the calculated parameters of the FETs 35a to 35c and 33. Thereafter, the processor 62 performs the processing of steps S12 to S18 of FIG. 10 to generate the model for the high frequency signal of the unit cell 30. The calculation of the parameter of the gate electrodes 14 in step S28 of FIG. 11 of the first embodiment and FIG. 19 of the first variation of the first embodiment may be performed prior to step S32 of FIG. 21, or prior to step S12 of FIG. 10.

Comparative Example

As illustrated in FIGS. 2 to 4, in the unit cell 30 (first element), the high frequency signal is inputted to the gate electrode 14 (first input electrode) and the high frequency signal is outputted from the drain electrode 16 (first output electrode). The source electrode 12 overlaps with the gate electrodes 14 and the drain electrode 16 when viewed in the X direction, and has a planar shape that is non-linearly symmetric with respect to any virtual straight line 36 extending in the X direction. As described above, when the planar shape of the source electrode 12 is asymmetric with respect to the virtual straight line 36, the launcher 40 of the measurement pattern for acquiring the high frequency characteristics is asymmetric like the measurement pattern 110 in FIG. 5. When the model of the high frequency characteristics of the unit cell 30 is generated using the measurement pattern 110, the current return paths 41a and 41b in the reference pads 42 illustrated in FIG. 5 are asymmetric with each other. This reduces the accuracy of the de-embedding. Thus, it is difficult to generate a highly accurate model of the unit cell 30.

First Embodiment and Variations Thereof

Thus, in the first embodiment and the variations thereof, in the measurement patterns 102, 104, 106 and 108 of FIGS. 12, 15, 16 and 20, the gate electrodes 14 (second input electrode) and the drain electrode 16 (second output electrode) of the FET 33, 35, 35d or 35e (second element) have planar shapes corresponding to the planar shapes of the gate electrodes 14 and the drain electrode 16 respectively in at least a partial region in the Y direction of the unit cell 30 in FIG. 2. Each of the source electrodes 12 (second reference electrode) overlaps the gate electrodes 14 and the drain electrode 16 when viewed in the X direction, and is linearly symmetric with respect to the virtual straight line 36 extending in the X direction. The virtual straight line 36 is, for example, the center line of the source electrodes 12 in the Y direction.

The input pad 44 is connected to the gate electrodes 14 and provided in the negative direction (i.e., second direction or – direction) of the Y direction of the gate electrode 14, and the output pad 46 is connected to the drain electrode 16 and provided in the positive direction (i.e., a direction opposite to the second direction or + direction) of the Y direction of the drain electrode 16. The reference pads 42 are connected to the source electrodes 12, provided from the input pad 44 to the output pad 46 when viewed from the X direction, and are linearly symmetric with respect to the virtual straight line 36.

As in step S10 of FIG. 10, the processor 62 (acquisition unit 72) acquires first high frequency characteristics of the FETs 33, 35, 35d or 35e measured by using the measurement patterns 102, 104, 106 and 108. As in step S12, the processor 62 (acquisition unit 72) acquires second high frequency characteristics of at least a part (via hole V22, distributed constant lines L12 and L18) of differences in shape between the unit cell 30 and the FETs 33, 35, 35d or 35e, calculated by simulation such as the electromagnetic field analysis. As in step S14, the processor 62 (calculation unit 74) calculates the high frequency characteristics of the unit cell 30 based on the first high frequency characteristics and the second high frequency characteristics. The measurement patterns 102, 104, 106 and 108 in which the reference pad 42 is linearly symmetric in the Y direction are used, so that the de-embedding can be performed with high accuracy. Therefore, the high frequency characteristics of the unit cell 30 can be calculated with high accuracy, and the high frequency model of the unit cell 30 with high accuracy can be provided. The high frequency characteristics of the via hole V22 and the distributed constant lines L12, L14, and L18 may be calculated using a simulation method other than electromagnetic field analysis.

As illustrated in FIG. 2, in the unit cell 30, the source electrodes 12, the gate electrodes 14, and the drain electrode 16 extend in the Y direction. The unit cell 30 has the first region 32 and the second region 34 arranged in the Y direction, and the width of the source electrode 12*a* in the region 34 in the X direction is narrower than the width of the source electrode 12*b* in the region 32 in the X direction. In such a structure of the source electrode 12, as in the measurement pattern 110 of FIG. 5, the reference pads 42 are connected to the source electrodes 12*b* in the region 32. Therefore, the reference pads 42 are asymmetric with respect to any of the virtual straight lines 36. The width of the source electrode 12*a* in the region 34 in the X direction is, for example, 0.9 times or less and 0.8 times or less of the width of the source electrode 12*b* in the region 32 in the X direction.

Thus, as in step S12 of FIG. 10, the processor 62 (the acquiring unit 72) acquires the second high frequency characteristics of the transmission line corresponding to the source electrode in the region 34 calculated by the simulation. As in step S14, the processor 62 (calculation unit 74) calculates the high frequency characteristics of the unit cell 30 based on the acquired first high frequency characteristics and the acquired second high frequency characteristics. Thus, the high frequency model of the unit cell 30 with high accuracy can be provided.

As illustrated in FIGS. 2 to 4, the source electrodes 12*b* in the region 32 are electrically connected to the metal layer 28 provided on the lower surface of the substrate 10 via the via holes 22 penetrating through the substrate 10. The source electrodes 12*a* in the region 34 are electrically connected to the metal layer 28 via the source electrode 12*b* and the via holes 22. No via hole is provided in region 34. In such a structure of the source electrode 12, the reference potential is supplied to the source electrodes 12*a* only through the source electrodes 12*b*. Therefore, as in the measurement pattern 110 of FIG. 5, the reference pads 42 are connected to the source electrodes 12*b* in the region 32. Therefore, the reference pads 42 are asymmetric with respect to any of the virtual straight lines 36.

Then, as in step S12 of FIG. 10, the processor 62 (acquisition unit 72) acquires the second high frequency characteristics of the via hole 22 in the region 32 calculated by the simulation. As in step S14, the processor 62 (calculation unit 74) calculates the high frequency characteristics of the unit cell 30 based on the acquired first high frequency characteristics and the acquired second high frequency characteristics. Thus, the high frequency model of the unit cell 30 with high accuracy can be provided.

As illustrated in FIG. 2, in the region 34 of the unit cell 30, the wiring 18*a* extends in the Y direction and overlaps with the source electrode 12*a* and the gate electrode 14 when viewed from the X direction. The source electrode 12*a* is disposed between the gate electrode 14 and the wiring 18*a* in the X direction. The wiring 18*a* and the gate electrode 14 are electrically connected at one or a plurality of positions in the Y direction. No wiring 18*a* is provided in the region 32. In the structure having such the wiring 18*a*, the reference pad 42 is asymmetric with respect to any virtual straight line 36 as in the measurement pattern 110 in FIG. 5.

Thus, as in step S12 of FIG. 10, the processor 62 (the acquiring unit 72) acquires the second high frequency characteristics of the transmission line corresponding to the wiring 18*a* calculated by simulation. As in step S14, the processor 62 (calculation unit 74) calculates the high frequency characteristics of the unit cell 30 based on the acquired first high frequency characteristics and the acquired second high frequency characteristics. Thus, the high frequency model of the unit cell 30 with high accuracy can be provided.

In the first embodiment and the variations thereof, an example of a transistor as a first element has been described, and an example of the gate electrode 14 as a first input electrode and a second input electrode, the drain electrode 16 as a first output electrode and a second output electrode, and the source electrode 12 as a first reference electrode and a second reference electrode has been described. The first element may be a high frequency element other than the transistor. The transistor may be a bipolar transistor other than the FET.

In addition, an example in which the pair of source electrodes 12 is provided so as to dispose the gate electrodes 14 and the drain electrode 16 between the pair of source electrodes 12 has been described. A single source electrode 12 may be used instead of the pair of source electrodes 12. When the pair of source electrodes 12 is provided, the pair of reference pads 42 is provided. In this case, first high frequency probes as GSG probes are contactable with the reference pads 42 and the input pad 44, and second high frequency probes as GSG probes are contactable with the reference pads 42 and the output pad 46. Thus, high frequency characteristics can be measured with high accuracy.

As in the first and the second variations of the first embodiment, the planar shapes of the gate electrodes 14 and the drain electrode 16 in the measurement pattern 104 (first measurement pattern) in FIG. 15 correspond to the planar shapes of the gate electrodes 14 and the drain electrode 16 in the region 32 of the unit cell 30 in FIG. 2, respectively. The planar shapes of the gate electrodes 14 and the drain electrode 16 of the measurement pattern 106 in FIG. 16 and the measurement pattern 108 (second measurement pattern) in FIG. 20 respectively correspond to the planar shapes of the gate electrodes 14 and the drain electrode 16 in at least a partial region of the region 34 of the unit cell 30 in FIG. 2 in the Y direction (i.e., any one of the region 34 or the regions 34*a* to 34*c* in FIG. 2). As described above, the first measurement pattern 104 and the second measurement pattern 106 or 108 are provided as a measurement pattern set.

In step S10 of FIG. 10, the processor 62 (acquisition unit 72) acquires the first high frequency characteristics of the FET 33 measured by using the first measurement pattern 104 and the second high frequency characteristics of the FET 35*d* or 35*e* measured by using the second measurement pattern 106 or 108. In step S12, the processor 62 (acquisition unit 72) acquires the third high frequency characteristics of the transmission line corresponding to the source electrode 12*a* in the region 34 calculated by the simulation. In step S14, the processor 62 (calculation unit 74) calculates the high frequency characteristics of the unit cell 30 based on the first high frequency characteristics, the second high frequency characteristics, and the third high frequency characteristics. Thus, the high frequency model of the unit cell 30 with high accuracy can be provided.

In the first embodiment, the measurement pattern set includes the measurement patterns 102 and 110, the open pattern and the short pattern for measurement pattern 102, and the open pattern and the short pattern for measurement pattern 110. In the first variation of the first embodiment, the measurement pattern set includes the measurement patterns 104, 106 and 110, the open pattern and the short pattern for measurement pattern 104, the open pattern and the short pattern for measurement pattern 106, and the open pattern and the short pattern for measurement pattern 110. In the second variation of the first embodiment, the measurement pattern set includes the measurement patterns 104, 108 and 110, the open pattern and the short pattern for measurement pattern 104, the open pattern and the short patterns for measurement pattern 108, and the open pattern and the short pattern for measurement pattern 110. In the first embodiment and the variations thereof, the measurement pattern set may not include the measurement pattern 110 and the open pattern and the short pattern for the measurement pattern 110. The measurement pattern set may be provided on the same substrate 10 (element substrate). The FET of FIG. 1 including the measurement pattern set and the unit cell 30 may be provided on the same substrate 10 (element substrate).

The center line of the source electrode 12 (and the reference pad 42) is a straight line extending in the X direction and passing through a midpoint between the most positive position and the most negative position in the Y direction of the source electrode 12 (and the reference pad 42). The same is true for other members.

Linear symmetry of the source electrode 12 (and the reference pad 42) with respect to the virtual straight line 36 does not have to be geometric symmetry. Linear symmetry (substantial linear symmetry) of the source electrode 12 (and reference pad 42) with respect to the virtual straight line 36 allows a difference to such an extent that the degradation of de-embedding accuracy by the current return paths 41a and 41b described in FIG. 5 is not a problem. When the source electrode 12 (and the reference pad 42) is linearly symmetric (substantially linearly symmetric) with respect to the virtual straight line 36, for example, an area of a region corresponding to the difference between the planar shape of a positive side of the source electrode 12 (and the reference pad 42) above the virtual straight line 36 in the Y direction and the planar shape acquired by moving the planar shape of a negative side of the source electrode 12 (and the reference pad 42) below the virtual straight line 36 geometrically linearly symmetric with respect to the virtual straight line 36 may be 10% or less of the area of the planar shape of the source electrode 12 (and the reference pad 42). The same is true for other members.

In the unit cell 30 of FIG. 2, the term that the source electrode 12 is non-linearly symmetric with respect to any virtual straight line 36 means that, for example, even if any virtual straight line 36 extending in the X direction is assumed, the area of the region corresponding to the difference between the planar shape of a positive side of the reference pad 42 above the virtual straight line 36 in the Y direction and the planar shape acquired by moving the planar shape of a negative side of the reference pad 42 below the virtual straight line 36 geometrically linearly symmetric with respect to the virtual straight line 36 may be 10% or more of the area of the planar shape of the reference pad 42. The same is true for other members.

The fact that the planar shape of the gate electrode 14 (and the drain electrode 16) of the FET 35 in FIG. 12 corresponds to the planar shape of the gate electrode 14 (and the drain electrode 16) of the unit cell 30 in FIG. 2 means that the planar shape does not have to be geometrically the same. An area of the region corresponding to a difference between the planar shape of the gate electrode 14 (and drain electrode 16) of the FET 35 in FIG. 12 and the planar shape of the gate electrode 14 (and drain electrode 16) of the unit cell 30 in FIG. 2 may be 10% or less of an area of the planar shape of the gate electrode 14 (and drain electrode 16) of the FET 35 in FIG. 12. The same is true for other measurement patterns and other members.

Each processing (each function) of the above-described embodiment is realized by a processing circuit (Circuity) including one or a plurality of processors. The processing circuit may be composed of integrated circuits combined with one or more memories, various analog circuits, various digital circuits and the like in addition to the one or more processors. The one or more memories store programs (instructions) for causing the one or more processors to execute the respective processes. The one or more processors may execute the respective processes according to the program read from the one or more memories, or may execute the respective processes according to one or more logic circuits designed to execute the respective processes in advance.

The processor may be any type of processor suitable for control of the computer, such as a CPU, a GPU (Graphic Processing Unit), a DSP (Digital Signal Processor), an FPGA (Field Program Gate Array), or an ASIC (Application Specific Integrated Circuit). The plurality of physically separated processors may cooperate with each other to execute the respective processes. For example, the processors installed in a plurality of physically separated computers may cooperate with each other to execute the respective processes via a network such as a LAN (Local Area Network), a WAN (Wide Area Network), or the Internet.

The program may be installed in the memory from an external server device or the like via the network, or may be distributed in a state of being stored in a recording medium such as a CD-ROM, a DVD-ROM or a semiconductor memory to be installed in the memory from the recording medium.

The embodiments disclosed here should be considered illustrative in all respects and not restrictive. The present disclosure is not limited to the specific embodiments described above, but various variations and changes are possible within the scope of the gist of the present disclosure as described in the claims.

What is claimed is:

1. A measurement pattern for measuring a high frequency characteristic of a first element, the first element including a first input electrode to which a high frequency signal is input, a first output electrode from which the high frequency signal is output, and a first reference electrode to which a reference potential is supplied, which overlaps with the first input electrode and the first output electrode when viewed from a first direction, and which has a planar shape that is non-linearly symmetric with respect to any virtual straight lines extending in the first direction, the measurement pattern comprising:
    a second element including:
        a second input electrode having a planar shape corresponding to a planar shape of the first input electrode in at least a partial region of the first element in a second direction orthogonal to the first direction;

a second output electrode having a planar shape corresponding to a planar shape of the first output electrode in the at least partial region; and a second reference electrode overlapping the second input electrode and the second output electrode when viewed from the first direction and having a planar shape that is linearly symmetric with respect to a virtual straight line extending in the first direction;

an input pad connected to the second input electrode;

an output pad connected to the second output electrode so as to dispose the second input electrode and the second output electrode between the input pad and the output pad in the second direction; and a reference pad connected to the second reference electrode, provided from the input pad to the output pad when viewed from the first direction, and having a planar shape that is linearly symmetric with respect to the virtual straight line.

2. The measurement pattern according to claim 1, wherein the first input electrode, the first output electrode, and the first reference electrode extend in the second direction, the first element has a first region and a second region arranged in the second direction, and a width in the first direction of the first reference electrode in the second region is narrower than a width in the first direction of the first reference electrode in the first region.

3. The measurement pattern according to claim 2, wherein the first element is provided on a substrate, the first reference electrode in the first region is electrically connected to a metal layer provided on a lower surface of the substrate via a via hole penetrating through the substrate, the first reference electrode in the second region is electrically connected to the metal layer via the first reference electrode and the via hole in the first region, and the second region is not provided with a via hole.

4. A calculation method executed by a processor to execute a process, the process comprising:

acquiring a first high frequency characteristic of the second element measured using the measurement pattern according to claim 3;

acquiring a second high frequency characteristic of the via hole in the first region, the second high frequency characteristic being calculated by simulation; and calculating a high frequency characteristic of the first element based on the first high frequency characteristic and the second high frequency characteristic.

5. The measurement pattern according to claim 2, wherein the first element includes a wiring extending in the second direction in the second region and overlapping with the first reference electrode and the first input electrode when viewed from the first direction, the first reference electrode is disposed between the first output electrode and the wiring in the first direction, the wiring and the first input electrode are electrically connected at one or more locations in the second direction, and the wiring is not provided in the first region.

6. A calculation method executed by a processor to execute a process, the process comprising:

acquiring a first high frequency characteristic of the second element measured using the measurement pattern according to claim 5;

acquiring a second high frequency characteristic of a transmission line corresponding to the wiring, the second high frequency characteristic being calculated by simulation; and calculating a high frequency characteristic of the first element based on the first high frequency characteristic and the second high frequency characteristic.

7. The measurement pattern according to claim 2, wherein the first element is a transistor, and the first input electrode, the first output electrode, and the first reference electrode are a gate electrode, a drain electrode, and a source electrode, respectively.

8. The measurement pattern according to claim 2, further comprising:

a first measurement pattern, wherein planar shapes of the second input electrode and the second output electrode correspond to planar shapes of the first input electrode and the first output electrode in the first region, respectively; and a second measurement pattern, wherein planar shapes of the second input electrode and the second output electrode correspond to planar shapes of the first input electrode and the first output electrode in at least a partial region of the second region in the second direction, respectively.

9. A calculation method executed by a processor to execute a process, the process comprising:

acquiring a first high frequency characteristic of the second element measured using the first measurement pattern of the measurement pattern set according to claim 8;

acquiring a second high frequency characteristic of the second element measured using the second measurement pattern of the measurement pattern set;

acquiring a third high frequency characteristic of the transmission line corresponding to the first reference electrode in the second region, the third high frequency characteristic being calculated by simulation; and calculating a high frequency characteristic of the first element based on the first high frequency characteristic, the second high frequency characteristic, and the third high frequency characteristic.

10. A calculation method executed by a processor to execute a process, the process comprising:

acquiring a first high frequency characteristic of the second element measured using the measurement pattern according to claim 2;

acquiring a second high frequency characteristic of a transmission line corresponding to the first reference electrode in the second region, the second high frequency characteristic being calculated by simulation; and calculating a high frequency characteristic of the first element based on the first high frequency characteristic and the second high frequency characteristic.

11. The measurement pattern according to claim 1, wherein a pair of first reference electrodes are provided so as to dispose the first input electrode and the first output electrode between the pair of first reference electrodes, and a pair of second reference electrodes are provided so as to dispose the second input electrode and the second output electrode between the pair of second reference electrodes.

12. The measurement pattern according to claim 1, wherein a first high frequency probe is contactable with the reference pad and the input pad and a second high frequency probe is contactable with the reference pad and the output pad.

13. A calculation method executed by a processor to execute a process, the process comprising:
   acquiring a first high frequency characteristic of the second element measured using the measurement pattern according to claim 1;
   acquiring a second high frequency characteristic in at least a part of a difference portion in shape between the first element and the second element, the second high frequency characteristic being calculated by simulation; and
   calculating a high frequency characteristic of the first element based on the first high frequency characteristic and the second high frequency characteristic.

14. A non-transitory computer-readable recording medium storing a program that causes a processor to execute a process, the process comprising:
   acquiring a first high frequency characteristic of the second element measured using the measurement pattern according to claim 1;
   acquiring a second high frequency characteristic in at least a part of a difference portion in shape between the first element and the second element, the second high frequency characteristic being calculated by simulation; and
   calculating a high frequency characteristic of the first element based on the first high frequency characteristic and the second high frequency characteristic.

15. A calculation device comprising:
   a memory; and
   a processor coupled to the memory and the processor configured to:
   acquire a first high frequency characteristic of the second element measured using the measurement pattern according to claim 1;
   acquire a second high frequency characteristic in at least a part of a difference portion in shape between the first element and the second element, the second high frequency characteristic being calculated by simulation; and
   calculate a high frequency characteristic of the first element based on the first high frequency characteristic and the second high frequency characteristic.

* * * * *